(12) United States Patent
Kawaguchi

(10) Patent No.: US 9,559,173 B2
(45) Date of Patent: Jan. 31, 2017

(54) NITRIDE SEMICONDUCTOR DEVICE USING INSULATING FILMS HAVING DIFFERENT BANDGAPS TO ENHANCE PERFORMANCE

(71) Applicant: Renesas Electronics Corporation, Koutou-ku, Tokyo (JP)

(72) Inventor: Hiroshi Kawaguchi, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/827,880

(22) Filed: Aug. 17, 2015

(65) Prior Publication Data
US 2016/0056274 A1    Feb. 25, 2016

(30) Foreign Application Priority Data

Aug. 25, 2014  (JP) .................................. 2014-170330

(51) Int. Cl.
*H01L 29/778*    (2006.01)
*H01L 29/20*    (2006.01)
(Continued)

(52) U.S. Cl.
CPC ......... *H01L 29/2003* (2013.01); *H01L 29/423* (2013.01); *H01L 29/4234* (2013.01); *H01L 29/42376* (2013.01); *H01L 29/66462* (2013.01); *H01L 29/7786* (2013.01); *H01L 29/402* (2013.01); *H01L 29/408* (2013.01); (Continued)

(58) Field of Classification Search
CPC .................................... H01L 29/778–29/7789
See application file for complete search history.

(56) References Cited

U.S. PATENT DOCUMENTS

| 5,923,072 A | * | 7/1999 | Wada | ................ | H01L 21/28581 |
|  |  |  |  |  | 257/192 |
| 7,019,336 B2 | * | 3/2006 | Yamashita | ........ | H01L 29/42316 |
|  |  |  |  |  | 257/104 |

(Continued)

FOREIGN PATENT DOCUMENTS

JP        2013-118343 A    6/2013

OTHER PUBLICATIONS

Extended European Search Report issued Mar. 14, 2016, in European Patent Application No. EP15181512.3.

*Primary Examiner* — Eric Ward
(74) *Attorney, Agent, or Firm* — Shapiro, Gabor and Rosenberger, PLLC

(57) ABSTRACT

The semiconductor device includes: a channel layer, a barrier layer, a first insulating film, and a second insulating film, each of which is formed above a substrate; a trench that penetrates the second insulating film, the first insulating film, and the barrier layer to reach the middle of the channel layer; and a gate electrode arranged in the trench and over the second insulating film via a gate insulating film. The bandgap of the second insulating film is smaller than that of the first insulating film, and the bandgap of the second insulating film is smaller than that of the gate insulating film GI. Accordingly, a charge (electron) can be accumulated in the second (upper) insulating film, thereby allowing the electric field strength at a corner of the trench to be improved. As a result, a channel is fully formed even at a corner of the trench, thereby allowing an ON-resistance to be reduced and an ON-current to be increased.

18 Claims, 32 Drawing Sheets

(51) Int. Cl.
*H01L 29/423* (2006.01)
*H01L 29/66* (2006.01)
H01L 29/40 (2006.01)
H01L 29/792 (2006.01)

(52) U.S. Cl.
CPC .... *H01L 29/4236* (2013.01); *H01L 29/42364* (2013.01); *H01L 29/66833* (2013.01); *H01L 29/792* (2013.01)

(56) References Cited

U.S. PATENT DOCUMENTS

| | | | |
|---|---|---|---|
| 7,910,955 B2* | 3/2011 | Endoh | H01L 29/66462 257/194 |
| 2009/0206371 A1* | 8/2009 | Oka | H01L 29/4236 257/201 |
| 2013/0248874 A1 | 9/2013 | Kuraguchi | |
| 2014/0084300 A1 | 3/2014 | Okamoto et al. | |

* cited by examiner

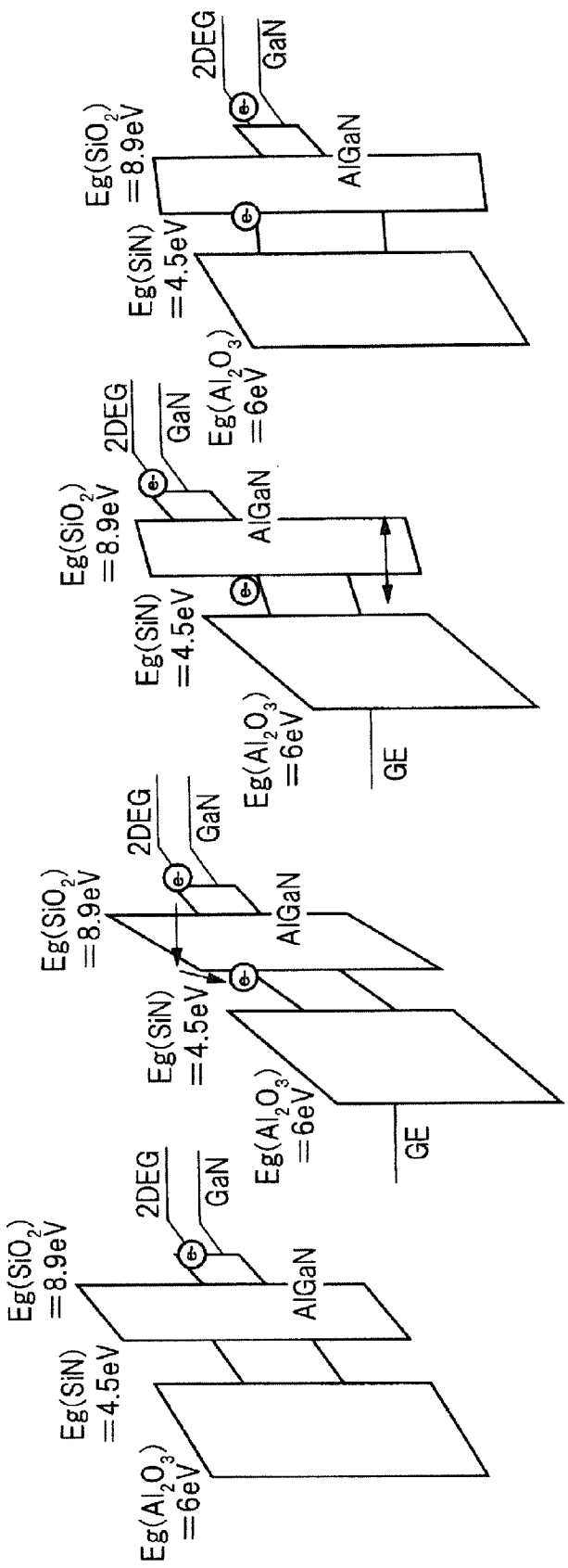

NITRIDE SEMICONDUCTOR DEVICE USING INSULATING FILMS HAVING DIFFERENT BANDGAPS TO ENHANCE PERFORMANCE

CROSS-REFERENCE TO RELATED APPLICATIONS

The disclosure of Japanese Patent Application No. 2014-170330 filed on Aug. 25, 2014 including the specification, drawings and abstract is incorporated herein by reference in its entirety.

BACKGROUND

The present invention relates to a semiconductor device and a manufacturing method of a semiconductor device, and can be preferably used in a semiconductor device using, for example, a nitride semiconductor and a manufacturing method thereof.

In recent years, semiconductor devices using group III-V compounds, each of which has a bandgap larger than that of Si, have attracted attention. Among them, semiconductor devices using gallium nitride (GaN) are being developed, because gallium nitride is a material having advantages that: 1) the breakdown electric field is large; 2) the electron saturation velocity is large; 3) the thermal conductivity is large; 4) a good heterojunction can be formed between AlGaN and GaN; 5) gallium nitride is non-poisonous and highly safe; and the like.

Further, semiconductor devices, each of which is a power MISFET (Metal Insulator Semiconductor Field Effect Transistor) using gallium nitride because of its high withstand voltage and a high-speed switching characteristic and in each of which a normally-off operation can be performed, are being developed.

For example, Japanese Unexamined Patent Application Publication No. 2013-118343 discloses a MIS-type compound semiconductor device adopting a gate recess structure. In this semiconductor device, a recess for a gate electrode is formed in an interlayer insulating film, a passivation film, and a compound semiconductor lamination.

SUMMARY

The present inventors are engaged in the research and development of a semiconductor device using the aforementioned nitride semiconductor, and are intensively studying to improve the characteristics of a normally-off type semiconductor device. In the course of the research and development, it has revealed that there is room for further improvement in the characteristics of a semiconductor device using a nitride semiconductor.

Other problems and new characteristics will become clear from the description and accompanying drawings of the present specification.

Of the preferred embodiments disclosed in the present application, outlines of the typical ones will be briefly described as follows.

A semiconductor device according to one embodiment disclosed in the present application has both a trench, which penetrates an upper insulating film, a lower insulating film, and a barrier layer to reach the middle of a channel layer, and a gate electrode arranged in the trench and over the upper insulating film via a gate insulating film. The bandgap of the upper insulating film is smaller than that of the lower insulating film. Additionally, the bandgap of the upper insulating film is smaller than that of the gate insulating film.

In a semiconductor device according to a typical embodiment that is disclosed in the present application and described below, the characteristics of the semiconductor device can be improved.

BRIEF DESCRIPTION OF THE DRAWINGS

FIGS. 15A to 15D are band diagrams illustrating situations of charge injection;

DETAILED DESCRIPTION

Figure 1:
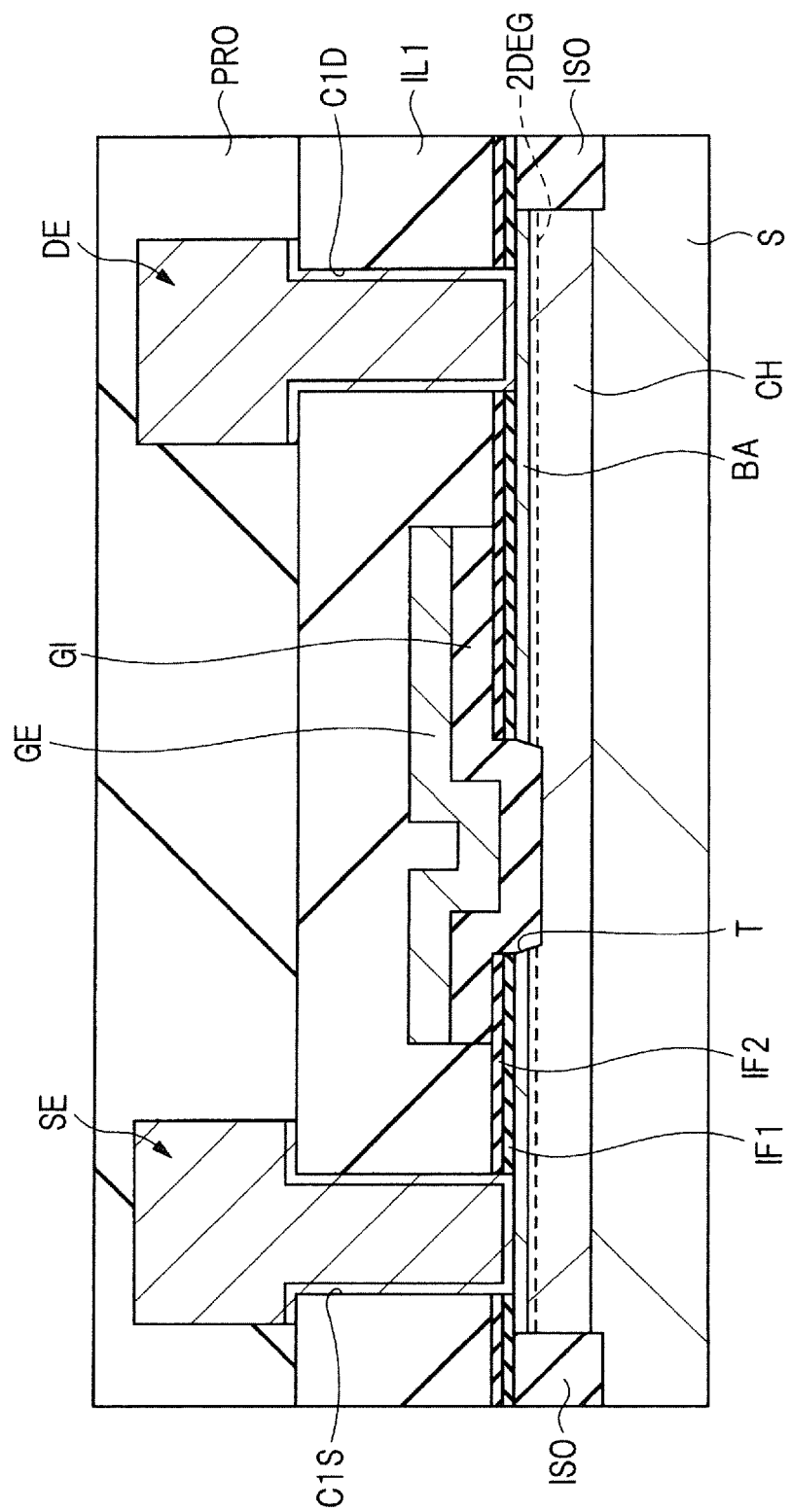
FIG. 1 is a sectional view illustrating a configuration of a semiconductor device according to First Embodiment.

If needed for convenience, the following embodiments will be described by dividing each of them into multiple sections or embodiments; however, the multiple sections or embodiments are not irrelevant to each other, but they are in a relationship in which one is a variation, application example, detailed description, or supplementary description of part or the whole of the others, unless otherwise indicated. When the numbers of elements, etc. (including numbers of pieces, numerical values, amounts, ranges, etc.) are referred to in the following embodiments, the numbers are not limited to the specific ones but may be more or less than the specific numbers, unless otherwise indicated or except when the numbers are obviously limited to the specific numbers in principle.

Further, in the following embodiments, the constituents (also including element steps, etc.) are not necessarily essential, unless otherwise indicated or clearly essential in principle. Similarly, when the shapes and positional relations, etc., of the constituents, etc., are referred to in the following embodiments, those substantially the same or similar to the shapes, etc., should also be included, unless otherwise indicated or except when considered to be clearly otherwise in principle. The same is true with the aforementioned numbers, etc., (including the numbers of pieces, numerical values, amounts, and ranges, etc.).

Hereinafter, preferred embodiments will be described in detail with reference to the accompanying views. In the whole views for explaining the embodiments, members having the same function as each other will be denoted with the same or relevant reference numeral and duplicative description will be omitted. When a plurality of similar members (parts) are present, an individual or specific part may be represented by adding a sign to the collective reference numeral. In the following embodiments, description of the same or similar parts will not be repeated in principle, unless particularly necessary.

In the views used in the embodiments, hatching may be omitted even in sectional views in order to make them easier to see.

In a sectional view or a plan view, the size of each part does not correspond to that of an actual device, and a specific part may be displayed to be relatively large in order to make the view easier to understand. The same is true with the case where a sectional view and a plan view correspond to each other.

First Embodiment

Hereinafter, a semiconductor device according to the present embodiment will be described in detail with reference to the views.

[Structure Description]

Figure 2:
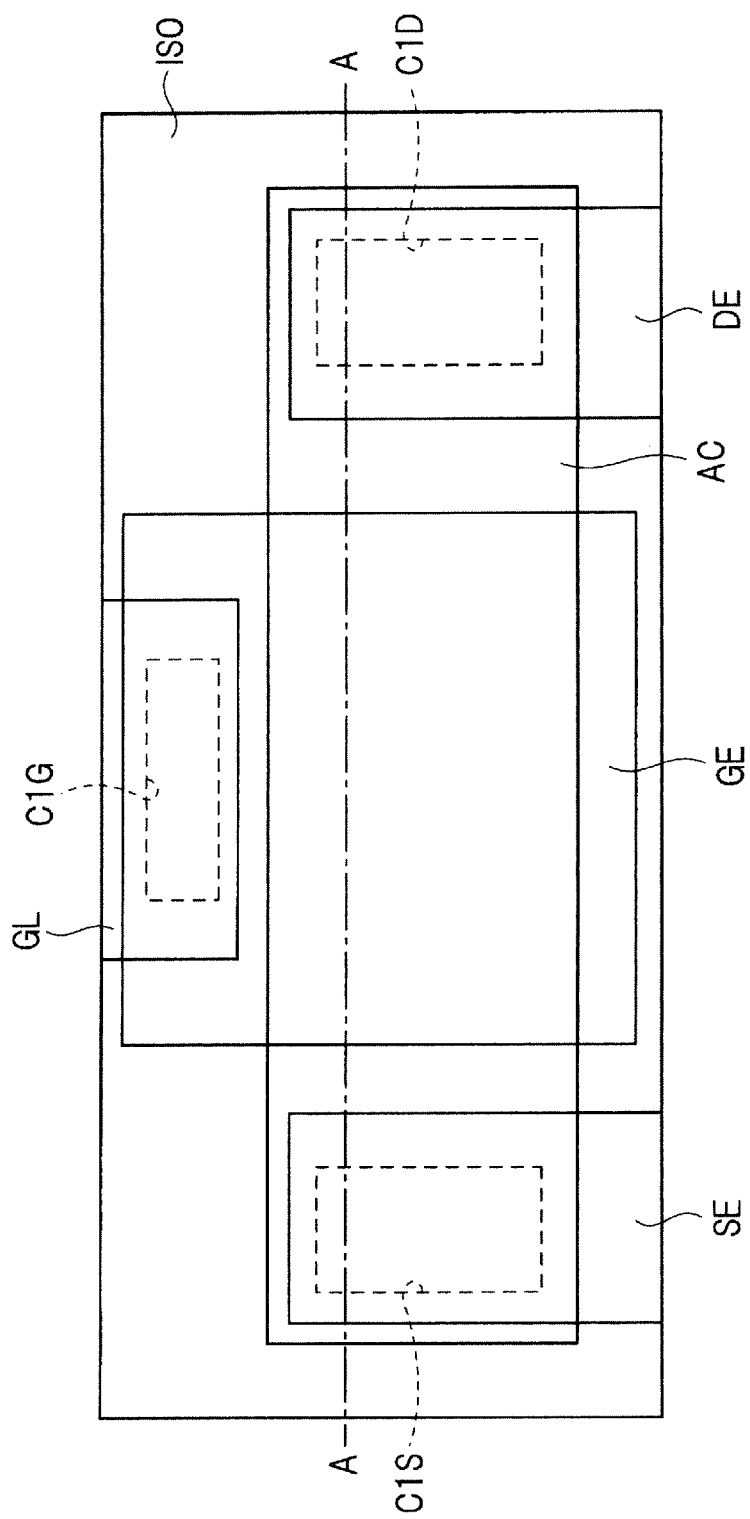
FIG. 2 is a plan view illustrating the configuration of the semiconductor device according to First Embodiment.

FIG. 1 is a sectional view illustrating a configuration of the semiconductor device according to the present embodiment. FIG. 2 is a plan view illustrating the configuration of the semiconductor device according to the embodiment. The sectional view of FIG. 1 corresponds, for example, to A-A Section in FIG. 2.

The semiconductor device according to the present embodiment is a MIS (Metal Insulator Semiconductor) type FET (Field Effect Transistor) using a nitride semiconductor. This semiconductor device is also referred to as an HEMT (High Electron Mobility Transistor) or a power transistor. The semiconductor device according to the embodiment is a so-called recess gate-type semiconductor device.

In the semiconductor device according to the present embodiment, a channel layer CH and a barrier layer BA are formed in this order over a substrate S, as illustrated in FIG. 1. An active region AC, in which a transistor is to be formed, is divided by an element isolation region ISO (see FIG. 2).

An insulating film (IF1, IF2) is formed over the barrier layer BA. This insulating film includes two layers of insulating films. A lower insulating film IF1 is formed over the barrier layer BA, and an upper insulating film IF2 is formed over the lower insulating film IF1.

This insulating film (IF1, IF2) has a role of an etching stopper when a gate electrode GE is patterned. The upper insulating film IF2 is a film having a bandgap smaller than that of the lower insulating film IF1. Additionally, the upper insulating film IF2 is a film having a bandgap smaller than that of the later-described gate insulating film GI (see FIG. 15).

The gate electrode GE is formed, via the gate insulating film GI, in a trench T that penetrates the insulating film (IF1, IF2) and the barrier layer BA to reach the middle of the channel layer CH. The channel layer CH and the barrier layer BA include a nitride semiconductor, and the barrier layer BA is a nitride semiconductor having a bandgap wider than that of the channel layer CH.

A two-dimensional electron gas 2DEG is generated in the vicinity of the interface between the channel layer CH and the barrier layer BA, the vicinity being near to the channel layer CH. When a threshold potential (potential V2>0, also referred to as a drive potential) is applied to the gate electrode GE, a channel is formed in the vicinity of the interface between the gate insulating film GI and the channel layer CH.

The two-dimensional electron gas 2DEG is formed by the following mechanism. The nitride semiconductors (herein, gallium nitride-based semiconductors), by which the channel layer CH and the barrier layer BA are formed, are different from each other in bandgap and electron affinity. Thereby, a square-well potential is generated in a junction surface between these semiconductors. The two-dimensional electron gas 2DEG is generated in the vicinity of the interface between the channel layer CH and the barrier layer BA by accumulating an electron in the square-well potential.

Herein, the two-dimensional electron gas 2DEG formed in the vicinity of the interface between the channel layer CH and the barrier layer BA is divided by the trench T in which the gate electrode GE is formed. Therefore, in the semiconductor device according to the present embodiment, an OFF state can be maintained while the threshold potential is not being applied to the gate electrode GE, and an ON state can be maintained with a channel being formed while the threshold potential is being applied thereto. Thus, a normally-off operation can be performed.

The configuration of the semiconductor device according to the present embodiment will be further described in detail. In the semiconductor device according to the embodiment, the channel layer CH including a nitride semiconductor is formed over the substrate S, and the barrier layer BA including a nitride semiconductor is formed over the channel layer CH, as illustrated in FIG. 1. Alternatively, a nucleation layer, a strain relaxation layer, and a buffer layer, etc., may be provided between the substrate S and the channel layer CH in this order from the substrate S side. These layers include a nitride semiconductor. The nucleation layer is formed in order to produce a crystal nucleus when a layer to be formed above, such as the strain relaxation layer, is growing. Additionally, the nucleation layer is formed in order to prevent the substrate S from deteriorating with the constituent of a layer to be formed above (e.g., Ga, etc.) diffusing from the layer to the substrate S. The strain relaxation layer is formed in order to suppress occurrence of a warp or crack in the substrate S by relaxing a stress to be applied to the substrate S. The buffer layer is an intermediate layer located between the channel layer CH and the strain relaxation layer.

The gate electrode GE is formed, via the gate insulating film GI, in the trench (also referred to as a recess) T that penetrates the insulating film (IF1, IF2) and the barrier layer BA and is dug to the middle of the channel layer CH.

Figure 5:
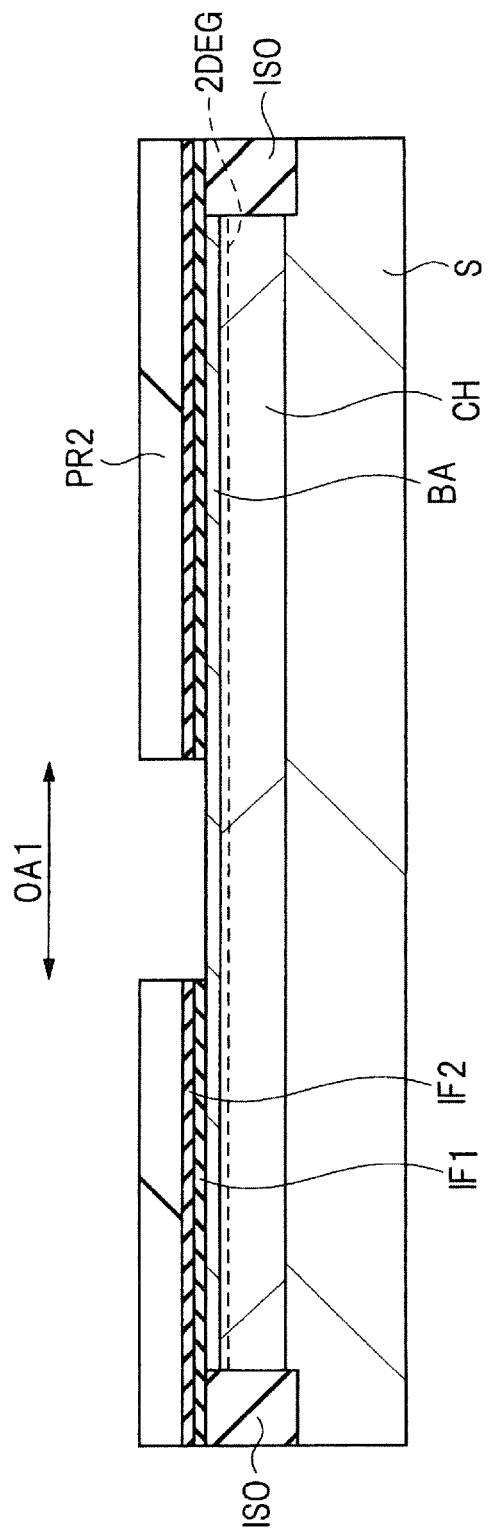
FIG. 5 is a sectional view illustrating a manufacturing step of the semiconductor device according to First Embodiment, the manufacturing step following FIG. 4.

The insulating film (IF1, IF2) has an opening in an opening region (OA1) (see FIG. 5). The trench T is formed to correspond to the opening.

The gate insulating film GI is formed in the trench T and over the insulating film (IF1, IF2). The gate electrode GE is formed over the gate insulating film GI. The shape of the gate electrode GE obtained when viewed from above (hereinafter, the shape is referred to as a planar shape) is, for example, rectangular (see FIG. 2). Herein, the planar shapes of the gate insulating film GI and the gate electrode GE are the same as each other.

The gate electrode GE has a shape protruding in one direction (to the right side, i.e., to a drain electrode DE side in FIG. 1). The protruding part is referred to as a field plate electrode (also referred to as a Faraday shield electrode). The field plate electrode is a partial region of the gate electrode GE extending from the end portion of the trench T near to the drain electrode DE toward the drain electrode DE.

The gate electrode GE also extends from the end portion of the trench T near to a source electrode SE toward the source electrode SE. The insulating film (IF1, IF2) is arranged below the gate electrode protruding (extending) toward the drain electrode DE or the source electrode SE.

Additionally, the source electrode SE and the drain electrode DE are formed over the barrier layer BA on both the sides of the gate electrode GE. The barrier layer BA and the source electrode SE are ohmic-coupled together via an ohmic layer. The barrier layer BA and the drain electrode DE are ohmic-coupled together via an ohmic layer. The source electrode SE includes both a coupling part (plug), located in a contact hole C1S formed in an interlayer insulating film IL1, and a wiring part located over the coupling part. The drain electrode DE includes both a coupling part (plug), located in a contact hole C1D formed in the interlayer insulating film IL1, and a wiring part located over the coupling part. The source electrode SE and the drain electrode DE are covered with a protective insulating film PRO. The planar shape of each of the source electrode SE and the drain electrode DE is, for example, rectangular (see FIG. 2).

The aforementioned gate electrode GE is coupled to gate wiring GL via a coupling part (plug) located in a contact hole C1G formed in the interlayer insulating film IL1 (see FIG. 2).

By thus forming the upper insulating film IF2 with a film having a bandgap smaller than that of the lower insulating film IF1, a charge (herein, electron) can be accumulated in the upper insulating film IF2, as described later, thereby allowing the electric field strength at a corner of the trench to be improved. As a result, a channel is fully formed even at the corner of the trench, thereby allowing an ON-resistance to be reduced and an ON-current to be increased. Thus, the driving capability of the transistor can be improved.

[Description of Manufacturing Method]

Subsequently, a manufacturing method of the semiconductor device according to the present embodiment will be described with reference to FIGS. 3 to 13, so that the configuration of the semiconductor device will be made clearer. FIGS. 3 to 13 are sectional views each illustrating a manufacturing step of the semiconductor device according to the embodiment.

Figure 3:
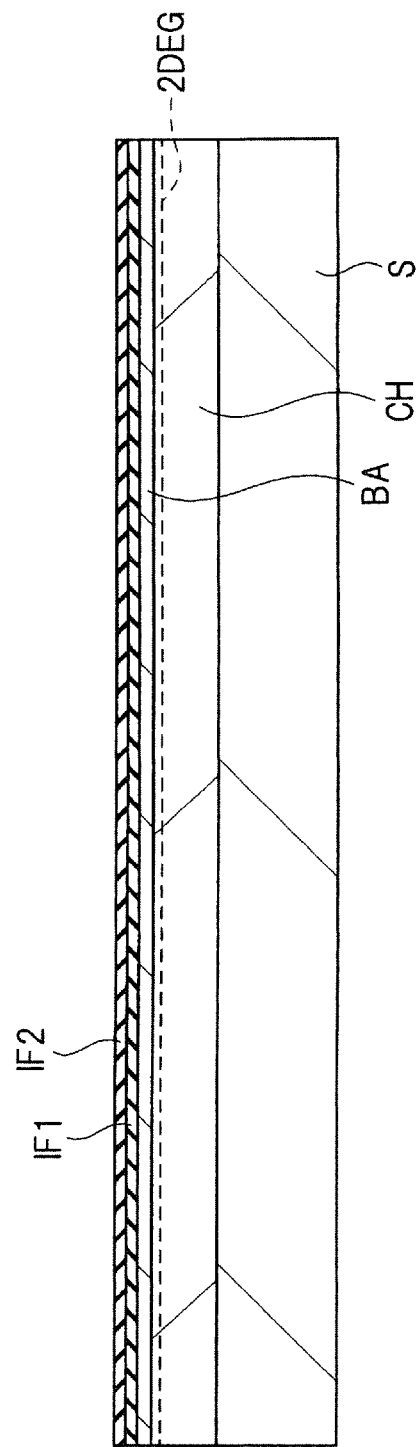
FIG. 3 is a sectional view illustrating a manufacturing step of the semiconductor device according to First Embodiment.

The channel layer CH is formed over the substrate S, as illustrated in FIG. 3. For example, a semiconductor substrate including silicon (Si) that has a resistivity of 1 Ω·cm and the (111) surface of which is exposed is used as the substrate S, and a gallium nitride (GaN) layer is heteroepitaxially grown thereover as the channel layer CH by using an MOCVD (Metal Organic Chemical Vapor Deposition) method, or the like. The thickness of the channel layer CH is, for example, approximately 1 μm. Alternatively, a substrate including Sic or sapphire, other than the silicon, may be used as the substrate S. Additionally, a nucleation layer, a strain relaxation layer, and a buffer layer may be provided between the substrate S and the channel layer CH in this order from the substrate S side. For example, an aluminum nitride (AlN) layer is used as the nucleation layer; a laminated film (AlN/GaN film) of a gallium nitride (GaN) layer and an aluminum nitride (AlN) layer is used as the strain relaxation layer; and an AlGaN layer, or the like, is used as the buffer layer. These layers can be formed by using an MOCVD method, or the like. In this case, the thickness of a portion ranging from the surface of the substrate S to the surface of the channel layer CH is approximately 3 to 5 μm.

Subsequently, for example, an AlGaN ($Al_xGa_{(1-x)}N$) layer is heteroepitaxially grown over the channel layer CH as the barrier layer BA by using an MOCVD method, or the like. The thickness of the AlGaN layer is, for example, approximately 0.03 μm.

Thus, a laminated body of the channel layer CH and the barrier layer BA is formed. The laminated body is formed by the aforementioned heteroepitaxial growth, i.e., by group-III-face growth in which lamination is performed in the [0001] crystal axis (C-axis) direction. In other words, the laminated body is formed by the (0001) Ga-face growth. The two-dimensional electron gas 2DEG is generated in the vicinity of the interface between the channel layer CH and the barrier layer BA, in the laminated body.

Subsequently, the insulating film (IF1, IF2) is formed over the barrier layer BA as a cover film. For example, a silicon oxide film ($SiO_2$ film, film including silicon oxide) is deposited, as the insulating film IF1, over the barrier layer BA by using a CVD (Chemical Vapor Deposition) method, or the like, so as to have a thickness of approximately 0.02 μm. Subsequently, a silicon nitride film ($Si_3N_4$ film, film including silicon nitride) is deposited, as the insulating film IF2, over the insulating film IF1 by using a CVD method, or the like, so as to have a thickness of approximately 0.02 μm. The bandgap of the lower silicon oxide film is approximately 8.9 eV, while that of the upper silicon nitride film is approximately 4.5 eV. Thus, the bandgap of the upper silicon nitride film is smaller than that of the lower silicon oxide film (see FIG. 15).

Figure 4:
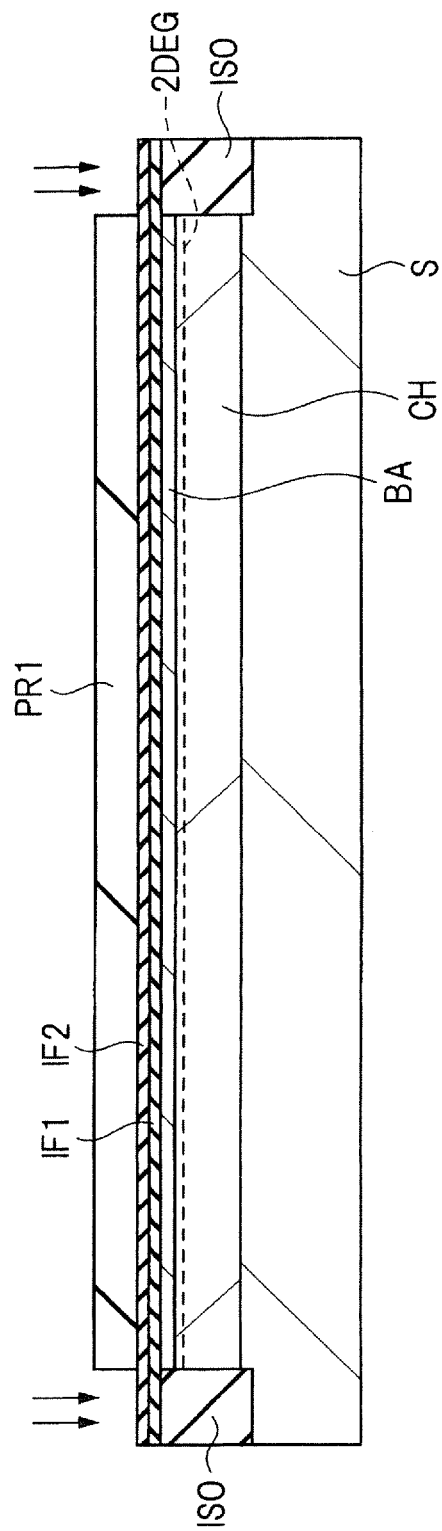
FIG. 4 is a sectional view illustrating a manufacturing step of the semiconductor device according to First Embodiment, the manufacturing step following FIG. 3.

Subsequently, a photoresist film PR1 for opening an element isolation region is formed over the insulating film (IF1, IF2) by using a photolithography technique, as illustrated in FIG. 4. Subsequently, boron (B) or nitrogen (N) is doped by using the photoresist film PR1 as a mask. The boron (B) or nitrogen (N) is injected into the channel layer CH and the barrier layer BA via the insulating film (IF1, IF2). By thus doping an ion species, such as boron (B), nitrogen (N), or the like, into the channel layer CH and the barrier layer BA, a crystal state is changed to have a higher resistance. The element isolation region ISO is thus formed. Thereafter, the photoresist film PR1 is removed. The region surrounded by the element isolation region ISO will serve as the active region AC (see FIG. 2).

Subsequently, a photoresist film PR2 having an opening in an opening region OA1 is formed over the insulating film IF2 by using a photolithography technique, as illustrated in FIG. 5. Subsequently, the insulating film (IF1, IF2) is etched by using the photoresist film PR2 as a mask. Herein, a process, in which a material of lower layer is thus processed into a desired shape by performing etching with the use of a photoresist film processed into a desired shape by photolithography (exposure, development) or a hard mask as a mask, is referred to as patterning. A gas, such as, for example, $CF_4$ or $CHF_3$, can be used as the etching gas for the silicon nitride film and the silicon oxide film. Thereby, the insulating film (IF1, IF2) having an opening in the opening region OA1 is formed over the barrier layer BA. In other words, the barrier layer BA is exposed in the opening region OA1 (FIG. 5).

Figure 6:
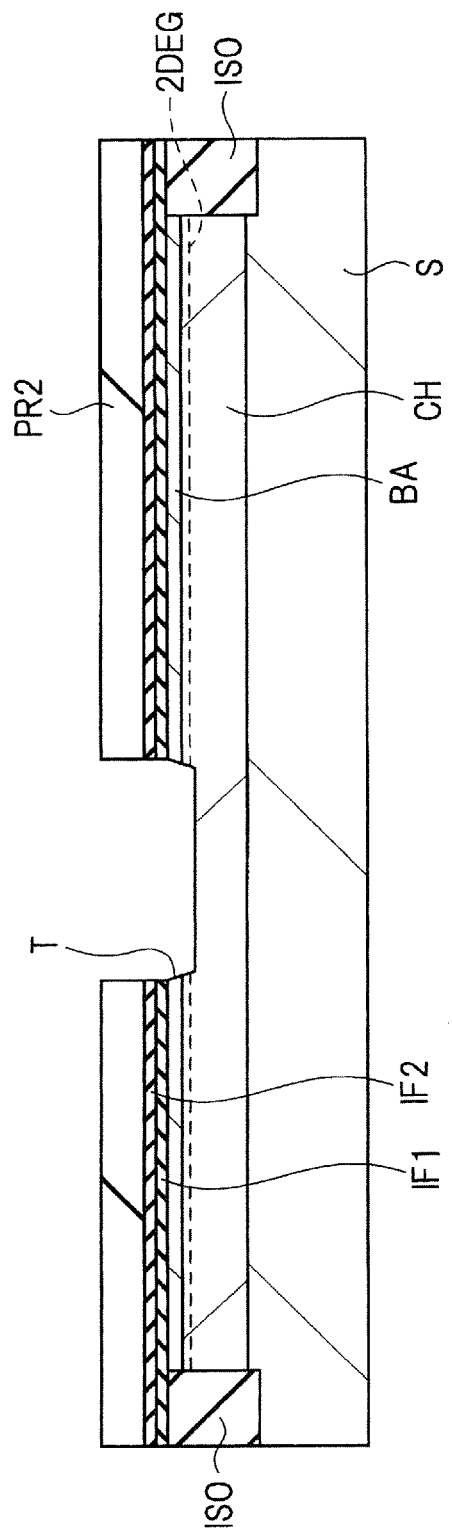
FIG. 6 is a sectional view illustrating a manufacturing step of the semiconductor device according to First Embodiment, the manufacturing step following FIG. 5.

Continuously, the trench T, which penetrates the insulating film (IF1, IF2) and the barrier layer BA to reach the middle of the channel layer CH, is formed by etching the barrier layer BA and the channel layer CH with the use of the photoresist film PR2 as a mask, as illustrated in FIG. 6. Dry etching is performed under plasma atmosphere by using, for example, a halogen-based gas ($Cl_2$, HBr, $BCl_3$, or the like) as the etching gas. For example, ICP (Inductively Coupled Plasma), or the like, can be used as the plasma source. When the barrier layer (AlGaN) BA having a thickness of 0.03 μm is used, the etching is performed to the depth of approximately 0.04 μm from the surface of the barrier layer (AlGaN) BA in order to surely remove the two-dimensional electron gas 2DEG in the opening region OA1. In other words, the level difference between the bottom surface of the barrier layer (AlGaN) BA and that of the trench T is approximately 0.01 μm. Thereby, the barrier layer (AlGaN) BA and the surface portion of the channel layer (GaN) CH in the opening region OA1 are removed, so that the channel layer (GaN) CH is exposed from the opening region OA1. Subsequently, the photoresist film PR2 is removed.

Figure 7:
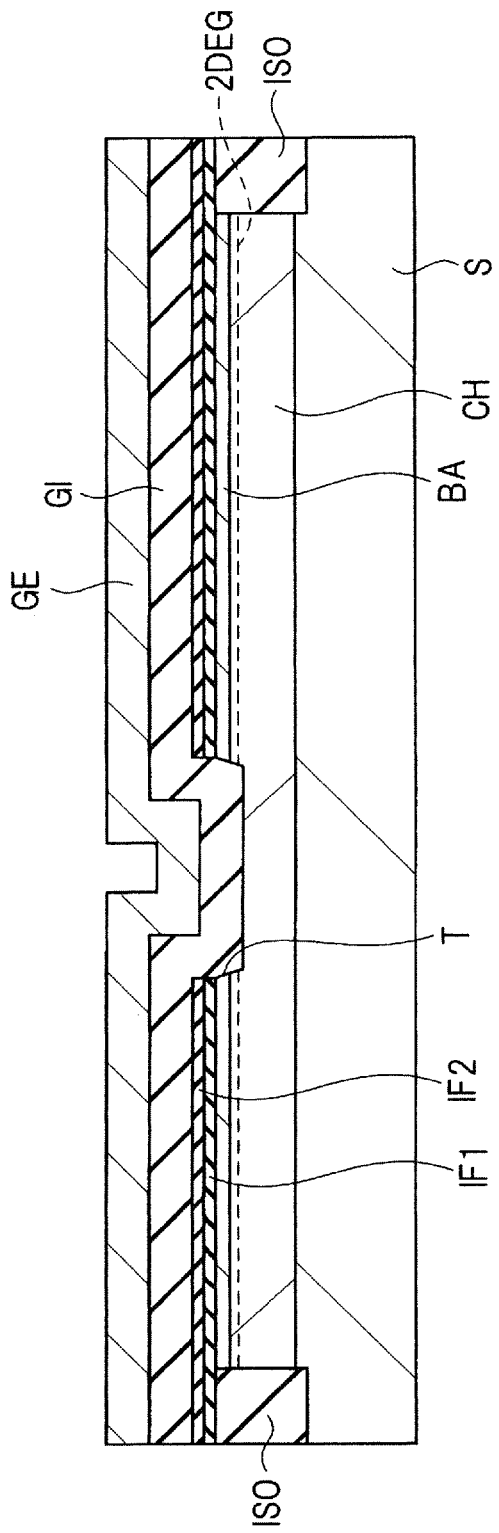
FIG. 7 is a sectional view illustrating a manufacturing step of the semiconductor device according to First Embodiment, the manufacturing step following FIG. 6.

Subsequently, the gate insulating film GI is formed in the trench T and over the insulating film (IF1, IF2), as illustrated in FIG. 7. For example, an aluminum oxide film (alumina, $Al_2O_3$) having a thickness of approximately 0.1 μm is deposited, as the gate insulating film GI, in the trench T and over the insulating film (IF1, IF2) by using an ALD (Atomic Layer Deposition) method, or the like. The bandgap of the gate insulating film GI is larger than that of the insulating film (silicon nitride film) IF2 located therebelow (see FIG. 15). The bandgap of the aluminum oxide film is approximately 6 eV, while that of the silicon nitride film located therebelow is approximately 4.5 eV.

As the gate insulating film GI, for example, a silicon oxide film or a high dielectric constant film having a dielectric constant higher than that of a silicon oxide film, other than the aforementioned aluminum oxide film, may be used. As the high dielectric constant film, other hafnium-based insulating films, such as a hafnium oxide film ($HfO_2$ film), a hafnium aluminate film, a HfON film (hafnium oxynitride film), a HfSiO film (hafnium silicate film), a HfSiON film (hafnium silicon oxynitride film), and a HfAlO film, may be used. The bandgap of each of such hafnium-based insulating films is larger than that of a silicon nitride film.

The type and the thickness of the gate insulating film GI are designed in consideration of the operating voltage, the reliability, and the breakdown voltage, etc., that are said to be necessary in a circuit operation. For example, when an aluminum oxide film or a silicon oxide film is used as the gate insulating film GI, long-term reliability that is practically sufficient is obtained by designing it to be used in an electric field of 2 to 4 MV/cm. Therefore, when a transistor is designed to operate at approximately 20 to 40 V, the thickness of the gate insulating film (aluminum oxide film or silicon oxide film) GI is required to be approximately 0.1 μm.

The thickness (0.1 μm) of the gate insulating film GI is mostly larger than the depth of the trench T. Herein, the depth of the trench is defined, as a first depth, by the level difference between the surface of the barrier layer BA and the bottom surface of the trench T (0.04 μm in the present embodiment). Additionally, the depth of the trench is defined, as a second depth, by the level difference between the surface of the upper insulating film IF2 and the bottom surface of the trench T (0.08 μm in the embodiment). When the thickness of the gate insulating film GI is 0.1 μm in the embodiment, the thickness of the gate insulating film is larger than the first depth and the second depth.

Subsequently, a conductive film to serve as the gate electrode GE is formed over the gate insulating film GI. For example, a laminated film (also referred to as an Au/Ni film) including, for example, a nickel (Ni) film and a gold (Au) film located therebelow is deposited, as the conductive film, over the gate insulating film GI by using a sputtering method, or the like.

Figure 8:
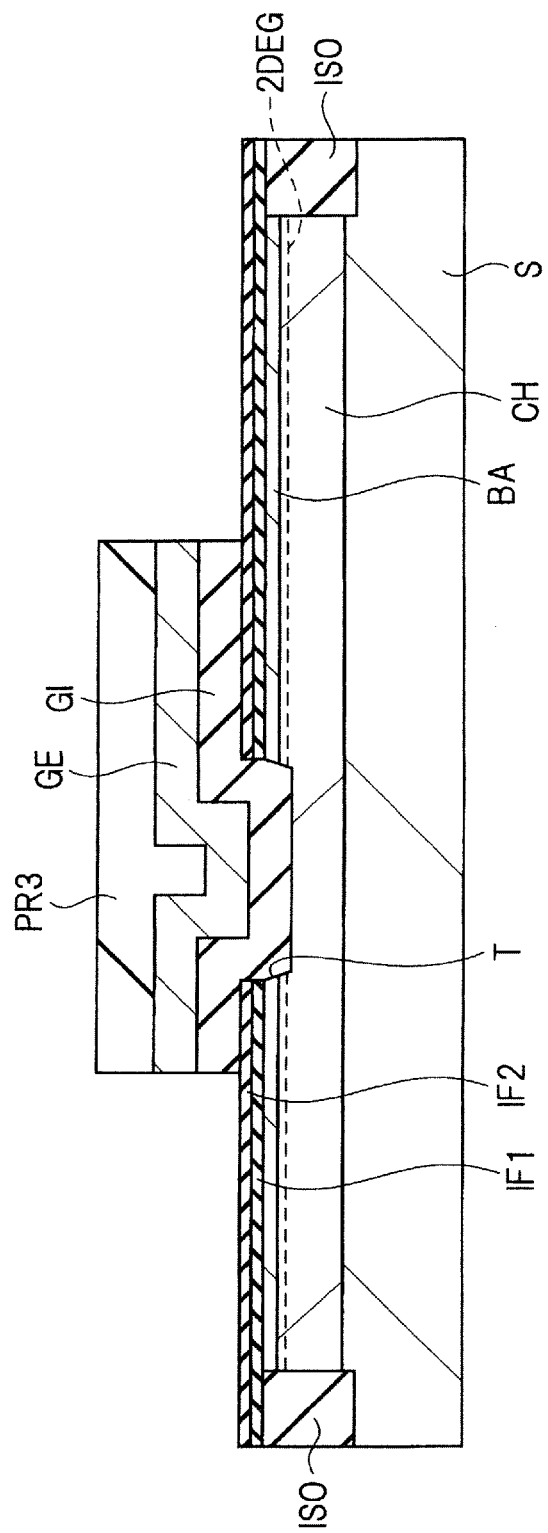
FIG. 8 is a sectional view illustrating a manufacturing step of the semiconductor device according to First Embodiment, the manufacturing step following FIG. 7.

Subsequently, the gate electrode GE is formed by patterning the gate electrode GE and the gate insulating film GI by using a photolithography technique and an etching technique, as illustrated in FIG. 8. A photoresist film PR3, covering the region where the gate electrode GE is formed, is formed by using, for example, a photolithography technique, so that the gate electrode GE and the gate insulating film GI are etched by using the photoresist film PR3 as a mask. Dry etching is performed under plasma atmosphere by using, for example, a halogen-based gas ($Cl_2$, HBr, or a mixed gas thereof) as the etching gas. For example, ICP (Inductively Coupled Plasma), or the like, can be used as the plasma source. Thereafter, the photoresist film PR3 is removed.

The insulating film (IF1, IF2) serves as an etching stopper during the etching. If dry etching is performed on the gate electrode GE and the gate insulating film GI that are directly formed over the barrier layer BA without forming the insulating film (IF1, IF2) by using the photoresist film PR3 as a mask, the barrier layer BA may be damaged. In particular, if the processing is performed under plasma atmosphere, plasma damage may be caused. Because of such damage, the two-dimensional electron gas is not well formed. Further, for example, if the thickness of the barrier layer BA is large, the crystalline property may be deteriorated and a rearrangement not preferred for a device operation may be remarkably generated, and conversely, when the thickness thereof is small, the concentration of the two-dimensional electron gas is decreased. Accordingly, it is preferable to form the barrier layer BA to have an appropriate thickness (e.g., thickness of approximately 0.02 to 0.04 μm). If the thickness of the barrier layer BA is thus small, there is the fear that the barrier layer BA may be partially etched when exposed to etching atmosphere, which causes the variation in the thickness to be large, and further the barrier layer may be partially lost. In such a case, the two-dimensional electron gas is not well formed, and for example, the resistance of the two-dimensional electron gas is increased. Thus, the operating characteristic of the transistor is deteriorated.

On the other hand, the insulating film (IF1, IF2) functions as an etching stopper in the present embodiment, and hence the two-dimensional electron gas is well formed and the characteristics of the transistor can be improved.

Because the insulating film (IF1, IF2) functions as an etching stopper, the surface of the insulating film (IF1, IF2) exposed at both the sides of the gate electrode GE may be retreated. The surface of the insulating film (IF1, IF2) exposed thereat may be thus retreated. However, it is preferable that the upper insulating film IF2 remains when the etching is ended. For example, when a silicon oxide film is used as the gate insulating film GI and when the lower insulating film (silicon oxide film) IF2 is exposed, the lower insulating film IF2 is rapidly etched and the lower barrier layer BA is exposed to etching atmosphere, which may cause the barrier layer BA to be damaged by etching. Accordingly, it is preferable to stop the etching in the state where the upper insulating film remains. The preferred thickness of the insulating film (IF1, IF2), for functioning as an an etching stopper, can be changed depending on etching conditions and the type of the insulating film; however, it is preferable in the present embodiment to cause the total thickness of the insulating films IF1 and IF2 to be, for example, approximately 0.03 to 0.1 μm. Additionally, it is preferable to cause the thickness of the upper insulating film IF2 to be approximately 0.02 to 0.07 μm in order to make the insulating film IF2 remain as much as possible when the etching is ended. Additionally, it is preferable to cause the thickness of the insulating film IF1 to be approximately 0.01 to 0.03 μm, in consideration that the later-described tunnel phenomenon is likely to be produced.

The gate electrode GE is patterned to have a shape protruding in one direction (to the right side, i.e., to the drain electrode DE side in FIG. 8). In other words, the patterning is performed such that a field plate electrode is provided as part of the gate electrodes GE. The field plate electrode is a partial region of the gate electrode GE, and refers to an electrode portion extending from the end portion of the trench T near to the drain electrode DE toward the drain electrode DE. The gate electrode GE also protrudes in another direction (to the left side, i.e., to the source electrode SE side in FIG. 8). However, the amount of the protrusion to the drain electrode DE side is larger than that to the source electrode SE side.

Figure 9:
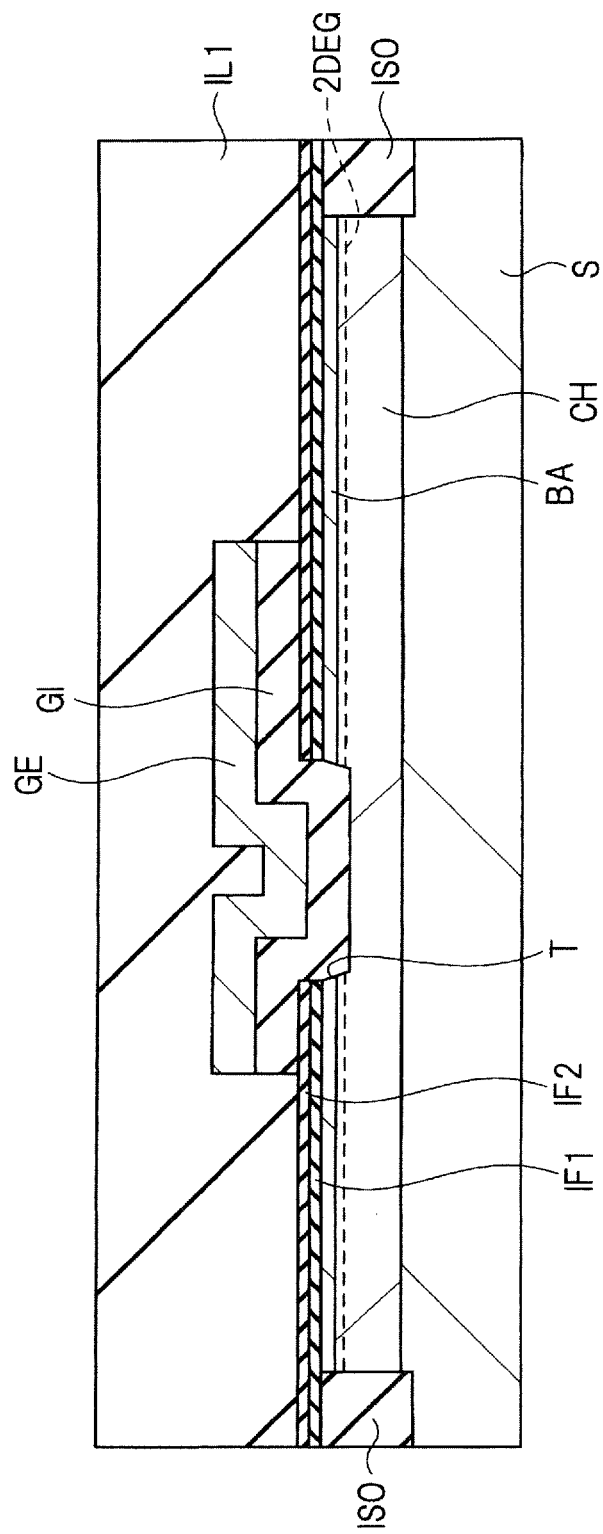
FIG. 9 is a sectional view illustrating a manufacturing step of the semiconductor device according to First Embodiment, the manufacturing step following FIG. 8.

Subsequently, the interlayer insulating film IL1 is formed over the gate electrode GE, as illustrated in FIG. 9. For example, a silicon oxide film is deposited, as the interlayer insulating film IL1, over the gate electrode GE and the insulating film (IF1, IF2) so as to have a thickness of approximately 0.7 μm, by using a CVD method, or the like.

Figure 10:
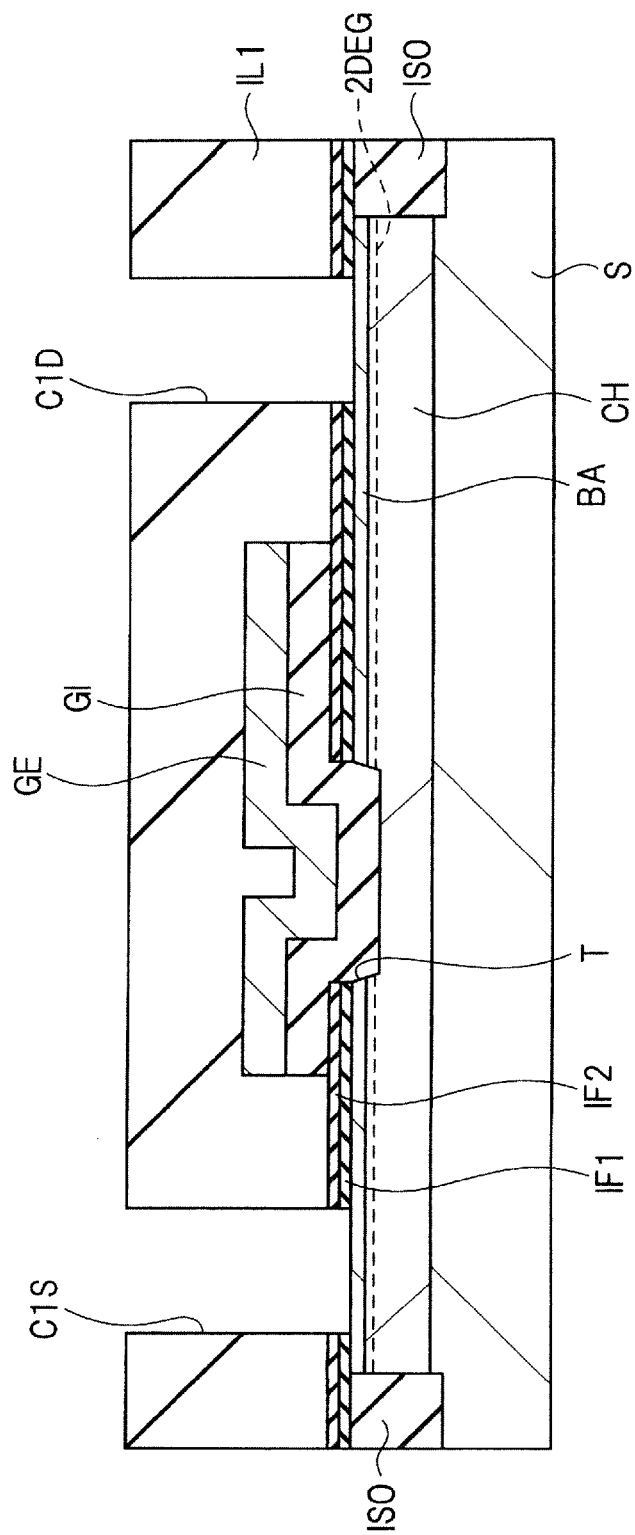
FIG. 10 is a sectional view illustrating a manufacturing step of the semiconductor device according to First Embodiment, the manufacturing step following FIG. 9.

Subsequently, the contact holes C1S and C1D are formed in the interlayer insulating film IL1 by using a photolithography technique and an etching technique, as illustrated in FIG. 10. By etching the interlayer insulating film IL1 in the region where the source electrode SE is formed with the use, for example, of a non-illustrated photoresist film as a mask, the contact hole C1S is formed, and by etching the interlayer insulating film IL1 in the region where the drain electrode DE is formed, the contact hole C1D is formed. In the etching, the insulating film (IF1, IF2) located below the interlayer insulating film IL1 is also removed. Thereby, the barrier layer BA is exposed from the bottom of each of the contact holes C1S and C1D. Each of the contact holes C1S and C1D is thus arranged over the barrier layer BA on both the sides of the gate electrode GE. The contact hole (C1G) is also formed over the gate electrode GE, when the contact holes C1S and C1D are formed (see FIG. 2).

Figure 11:
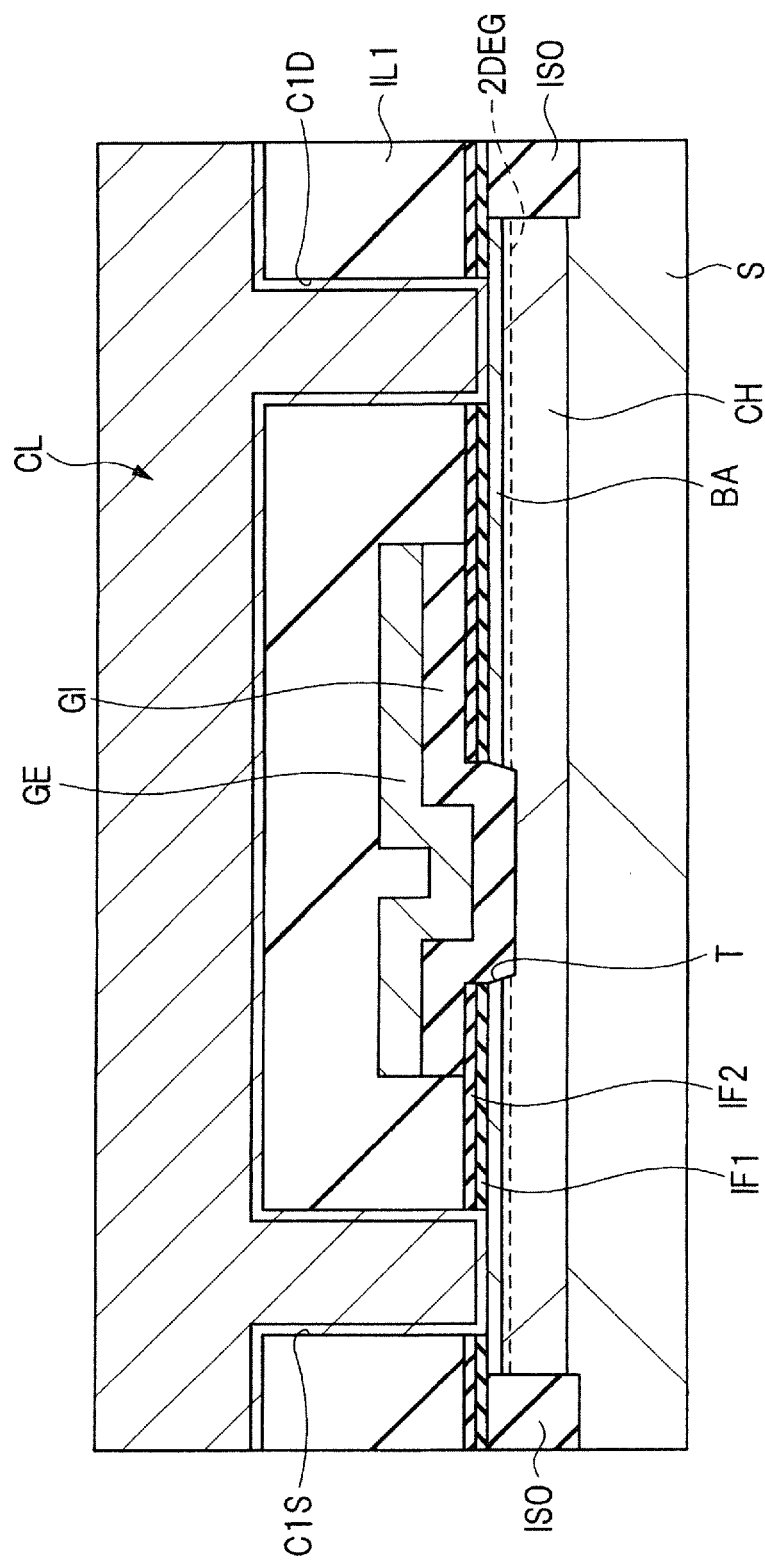
FIG. 11 is a sectional view illustrating a manufacturing step of the semiconductor device according to First Embodiment, the manufacturing step following FIG. 10.

Subsequently, a conductive film CL is formed over the interlayer insulating film IL1 including the insides of the contact holes C1S and C1D, etc., as illustrated in FIG. 11. The ohmic layer is first formed over the interlayer insulating film IL1 including the insides of the contact holes C1S and C1D. For example, a titanium (Ti) film is deposited over the interlayer insulating film IL1 including the insides of the contact holes C1S and C1D so as to have a thickness of approximately 0.05 μm, by using a sputtering method, or the like. Subsequently, an aluminum film is deposited, as a metal film, over the ohmic layer so as to have a thickness of approximately 0.6 μm, by using a sputtering method, or the like. Subsequently, a heat treatment is performed in order to reduce the coupling resistance between the barrier layer BA and the ohmic layer. The heat treatment is performed, for example, under nitrogen atmosphere at 650° C. for approximately 30 seconds. Alternatively, an aluminum alloy, other than aluminum, may be used as the metal film. For example, an alloy of Al and Si (Al—Si), that of Al and Cu (copper) (Al—Cu), and that of Al, Si, and Cu (Al—Si—Cu), etc., can be used as the aluminum alloy.

Figure 12:
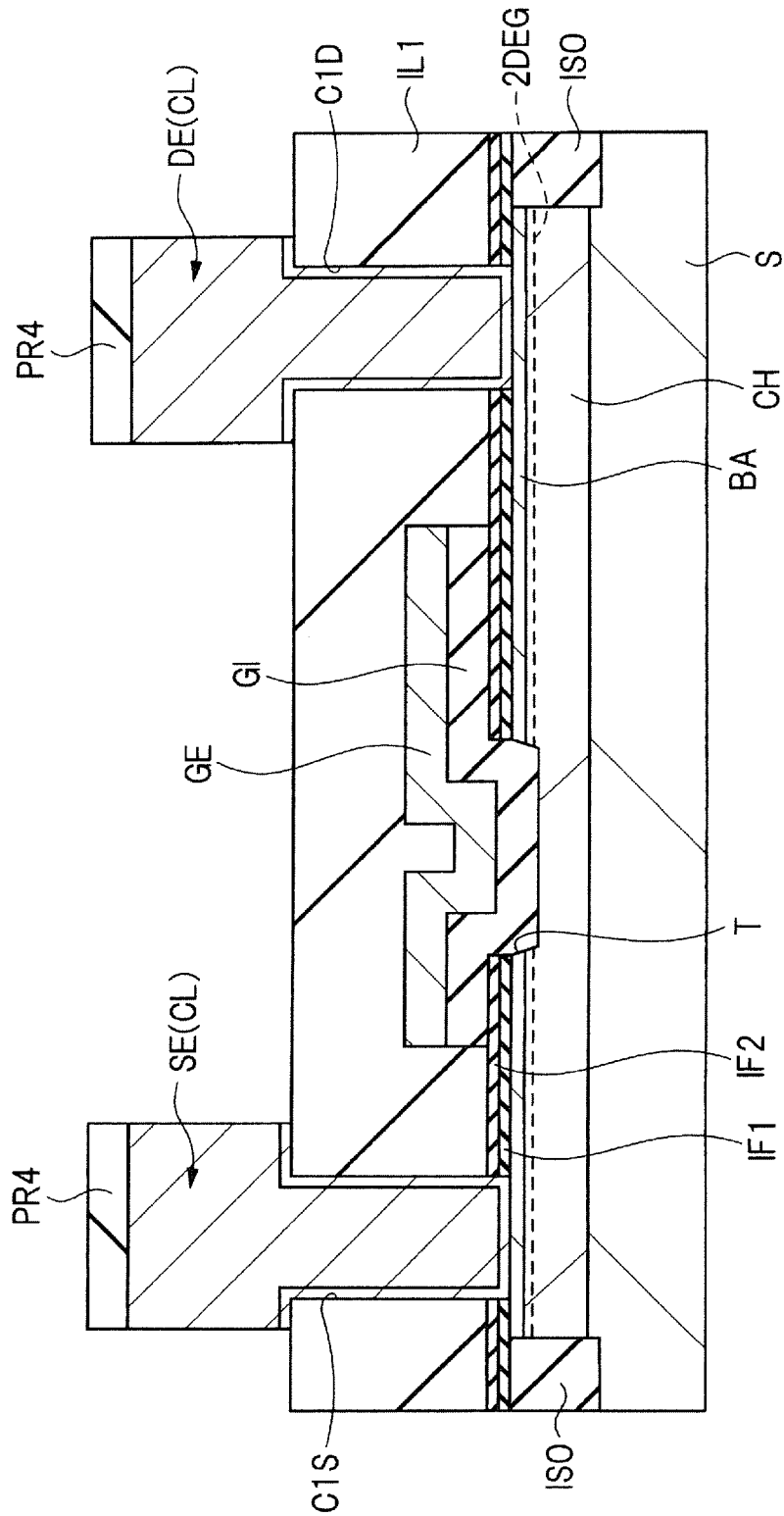
FIG. 12 is a sectional view illustrating a manufacturing step of the semiconductor device according to First Embodiment, the manufacturing step following FIG. 11.

Subsequently, the source electrode SE and the drain electrode DE are formed in and over the contact holes C1S and C1D by patterning the Ti/Al film with the use of a photolithography technique and an etching technique, as illustrated in FIG. 12. A photoresist film PR4, covering the region where the source electrode SE is formed and the region where the drain electrode DE is formed, is formed over the conductive film CL by using, for example, a photolithography technique, so that the conductive film CL is etched by using the photoresist film PR4 as a mask. Thereby, the source electrode SE and the drain electrode DE are formed. In this case, the conductive film CL is also embedded in the contact hole C1G over the gate electrode GE, and the gate wiring GL is formed thereover (see FIG. 2). Thereafter, the photoresist film PR4 is removed.

Figure 13:
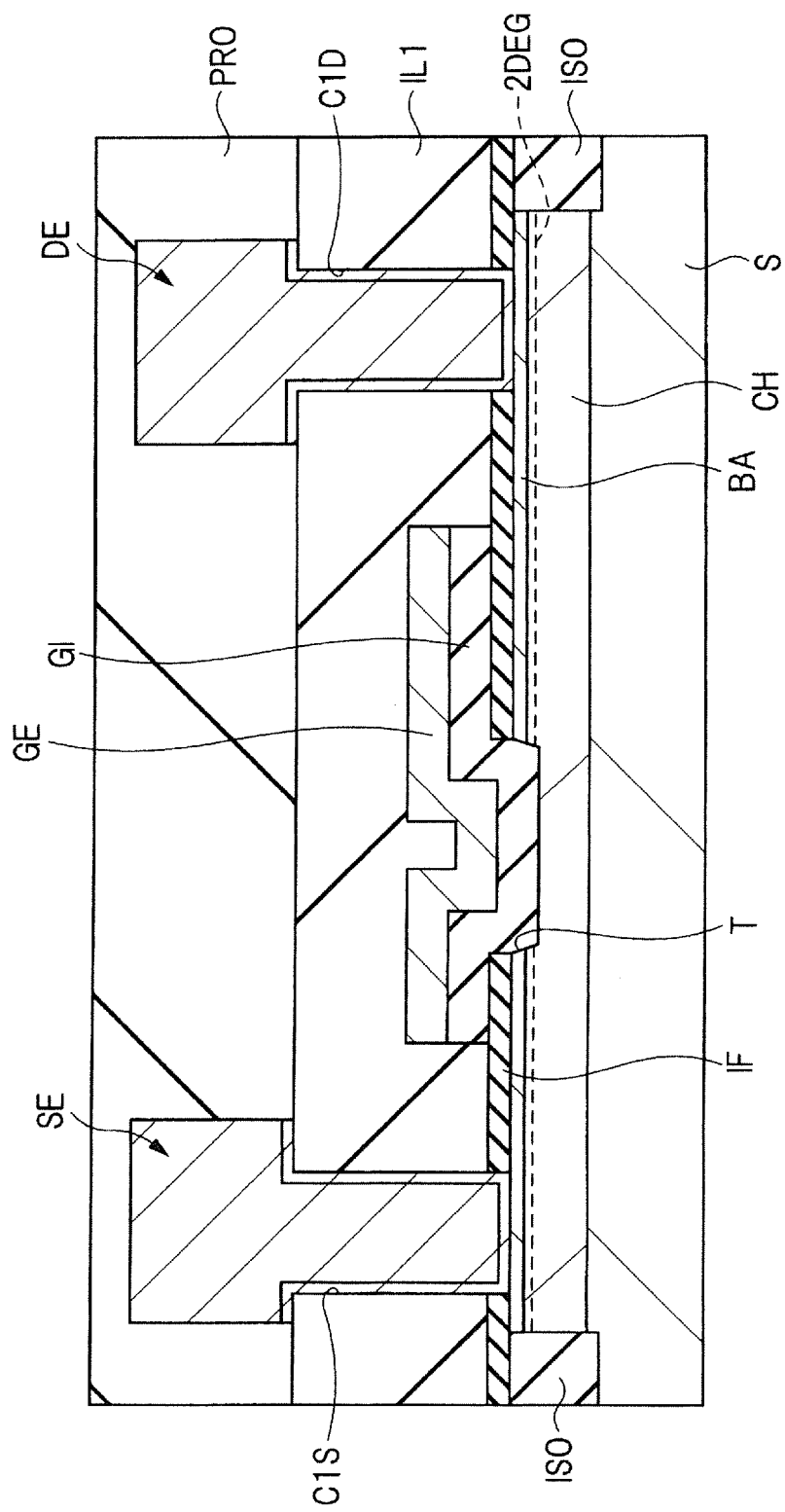
FIG. 13 is a sectional view illustrating a manufacturing step of the semiconductor device according to First Embodiment, the manufacturing step following FIG. 12.

Subsequently, the protective insulating film (also referred to as a surface protective film) PRO is formed over the insulating film IL1 including over the source electrode SE and the drain electrode DE, as illustrated in FIG. 13. For example, a silicon oxynitride (SiON) film is deposited, as the protective insulating film PRO, over the interlayer insulating film IL1 including over the source electrode SE and the drain electrode DE by using a CVD method, or the like.

The semiconductor device illustrated in FIG. 1 can be formed by the above steps. Herein, the above steps are one example, and the semiconductor device according to the present embodiment may be manufactured by the steps other than the above steps.

In the present embodiment, a charge (herein, electron) can be accumulated in the upper insulating film IF2 by forming the upper insulating film IF2 with a film having a bandgap smaller than that of the lower insulating film IF1, as described above, thereby allowing the electric field strength at a corner of the trench to be improved. As a result, a channel is fully formed even at a corner of the trench, thereby allowing an ON-resistance to be reduced and an ON-current to be increased. Thus, the driving capability of the transistor can be improved.

Figure 14A:
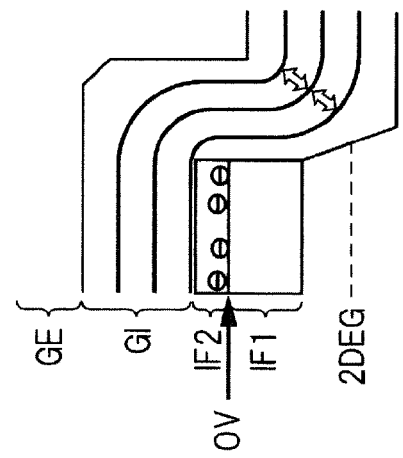
FIGS. 14A to 14D are schematic views of the vicinity of an end portion of the bottom surface of a trench, these views presented for explaining effects in First Embodiment.
Figure 14B:
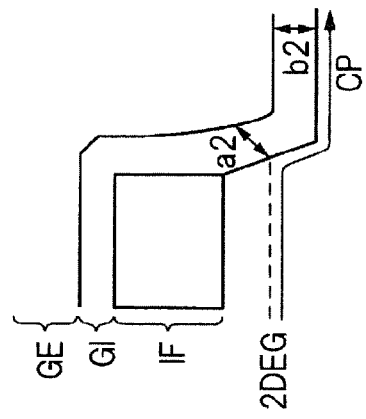

FIGS. 14A to 14D are schematic views of the vicinity of an end portion of the bottom surface of the trench, these views presented for explaining effects in the present embodiment. When a single-layer insulating film (e.g., silicon oxide film) IF is used as the cover film, the clearance between the equipotential curves located between the bottom surface of the insulating film IF and that of the gate electrode GE becomes large, as illustrated in FIG. 14A. On the other hand, when a charge (herein, electron) is accumulated in the upper insulating film IF2, as in the present embodiment, the clearance between the equipotential curves located between the bottom surface of the insulating film IF2 and that of the gate electrode GE becomes small, as illustrated in FIG. 14B. An ON-current can be made large by thus enhancing the electric field at a source end, thereby allowing the driving capability of the transistor to be improved.

Figure 14C:
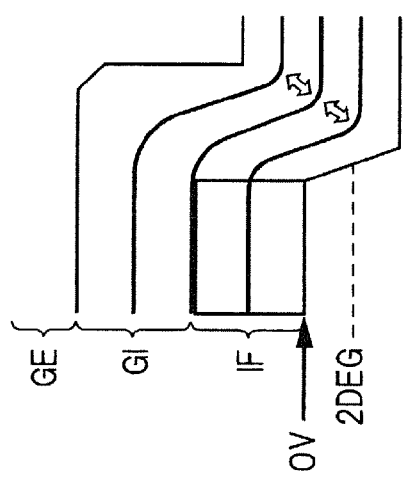
Figure 14D:
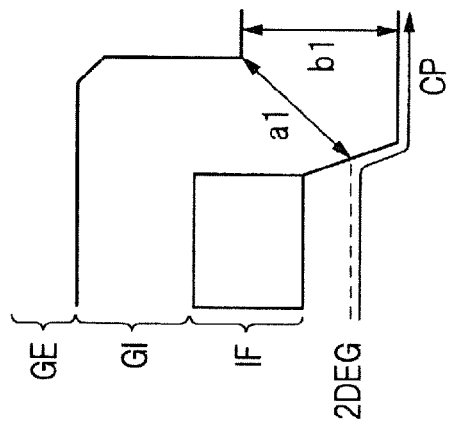

In particular, the thickness of the gate insulating film GI becomes large at an end portion (corner) of the bottom surface of the trench T, thereby possibly producing a situation in which the voltage applied to the gate electrode GE is relaxed and a channel is less likely to be formed. Additionally, when the thickness of the gate insulating film GI is so large as to be larger than the depth of the trench T (the first depth, the second depth), as illustrated in FIG. 14C, a situation is produced in which a channel is further less likely to be formed. For example, when the thickness of the gate insulating film GI is so large as to be larger than the depth of the trench T (the first depth, the second depth), as illustrated in FIG. 14C, the thickness of the gate insulating film GI at an end portion (corner) of the bottom surface of the trench T is likely to be relatively large, as compared to the case where the thickness thereof is so small as to be smaller than the depth of the trench T, as illustrated in FIG. 14D, thereby possibly producing a situation in which a channel is further less likely to be formed. Herein, CP represents a current pathway.

When the transistor is intended to be driven, for example, by a voltage of approximately 20 V or more in consideration of the withstand voltage of the transistor, the thickness of the gate insulating film GI is required to be 0.1 µm (1000 A) or more, as described above, even when an insulating material having a good withstand voltage (e.g., aluminum oxide or silicon oxide) is selected. On the other hand, if the depth of the trench T is made too large, there is the fear that a failure as described below may be produced. If the depth of the trench T is made too large, the etching of the trench T becomes difficult. Additionally, if the channel layer CH is dug deeply, the ratio, at which the current pathway (see CP in FIG. 14C) is occupied by the sidewall of the trench T when the transistor is operating, becomes large, thereby allowing the resistance to be increased. Accordingly, it is preferable that the bottom of the trench T is located at a depth of approximately 0.01 to 0.02 µm (approximately 0.01 µm in the present embodiment) from the boundary (two-dimensional electron gas 2DEG) between the barrier layer BA and the channel layer CH. It is possible to cause both the thickness of the barrier layer BA and the depth of the trench T to be large; in this case, however, it is difficult to ohmic-couple the source electrode SE to the barrier layer BA and the drain electrode DE to the barrier layer BA, thereby causing the resistances between them to be increased. Additionally, in order to form the barrier layer (AlGaN) BA so as to have a good crystalline property, it is preferable to adjust the thickness thereof within a range of 0.02 to 0.04 µm (200 to 400 A).

As described above, there is the tendency that the thickness of the gate insulating film GI becomes large and the depth of the trench T becomes small, which makes it more important to tackle the aforementioned problem that a channel is less likely to be formed.

On the other hand, a charge (herein, electron) can be accumulated in the upper insulating film IF2 by forming the upper insulating film IF2 with a film having a bandgap smaller than that of the lower insulating film IF1 according to the present embodiment, thereby allowing the electric field strength at a corner of the trench to be improved. Thereby, the electric field at a source end can also be enhanced, so that a channel can be formed effectively.

Figure 16:
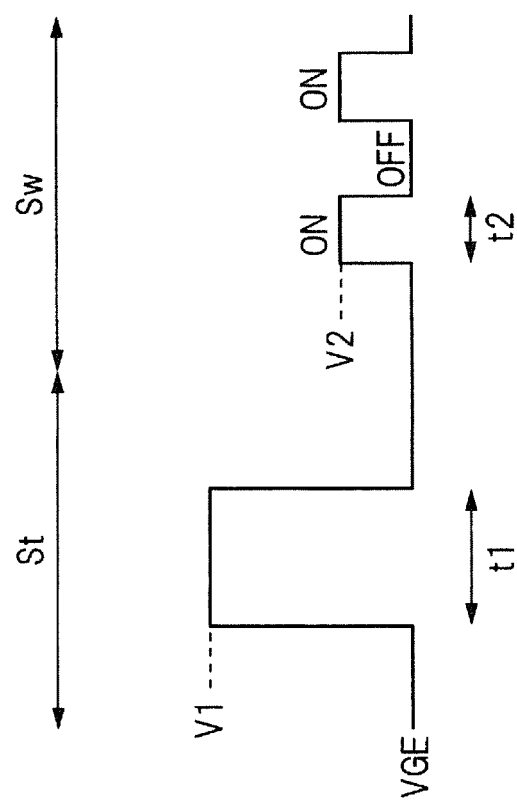
FIG. 16 is a timing chart illustrating both a step of injecting a charge into an upper insulating film in a transistor and a driving step of the transistor.

Subsequently, the reason why a charge (herein, electron) is accumulated in the upper insulating film IF2, and a method of accumulating a charge will be described with reference to FIGS. 15A to 16. FIGS. 15A to 15D are band diagrams illustrating situations of charge injection. FIG. 16 is a timing chart illustrating both a step of injecting a charge into the upper insulating film in the transistor and a driving step of the transistor.

Injection of a charge into the upper insulating film IF2 can be performed by providing, to the gate electrode GE, a high voltage (potential V1) of such a degree that a tunnel current flows through the lower insulating film IF1. For example, when the insulating film IF1, which has been described in the present embodiment and has a thickness of approximately 0.02 µm, is used, a charge can be injected into the upper insulating film IF2 from the two-dimensional electron gas 2DEG via the insulating film IF1 by applying a potential of approximately 30 to 50 V to the gate electrode GE. Alternatively, when the thickness of the insulating film IF1 is approximately 0.01 to 0.02 µm, a charge can be injected into the insulating film IF2 with a potential of approximately 30 to 50 V.

When the potential to be applied to the gate electrode GE is small (e.g., approximately 10 V), a tunnel phenomenon is not produced, as illustrated in FIG. 15A. On the other hand, when a high potential (e.g., approximately 40 V) is applied to the gate electrode GE, a tunnel phenomenon is produced and a charge is injected into the upper insulating film IF2 via the insulating film IF1, as illustrated in FIG. 15B. Because the bandgap of the upper insulating film (SiN) IF2 is smaller than that of the lower insulating film ($SiO_2$) IF1, the tunnel-injected electron ($e^-$) is accumulated in the upper insulating film (SiN) IF2. Further, the bandgap of the gate insulating film ($Al_2O_3$) is larger than that of the upper insulating film (SiN) IF2, the injected electron ($e^-$) is held in the upper insulating film (SiN) IF2. When charges are fully injected as illustrated in FIG. 15C, the potential difference between the arrows becomes small due to the injection of charges. The injected charges are held also in the state where a potential is not being applied to the gate electrode GE. Additionally, when the transistor is operating, that is, when the transistor is caused to be in a conduction state by applying the threshold potential (e.g., approximately 10 V) to the gate electrode, a tunnel phenomenon is not produced as illustrated in FIG. 15D, and hence a new charge is not injected and the injected electrons ($e^-$) are still held in the upper insulating film (SiN) IF2, thereby causing no trouble in an ON operation of the transistor.

For example, the potential (electron injection potential) V1 is applied to the gate electrode GE for a period t1 in a stand-by period St, as illustrated in FIG. 16. In this state, each of a source potential and a drain potential is, for example, 0 V. Thereby, a charge is accumulated in the upper insulating film IF2. Thereafter, the transistor is caused to be in an ON state by applying, to the gate electrode GE, the potential (threshold potential) V2 for a period t2 in a switching period Sw during which the transistor is ON/OFF operated. In this state, the source potential is, for example, 0 V and the drain potential is, for example, 0 to 10 V. The potential V1 is larger than the potential V2. The potential V1 is 30 to 50 V, and the potential V2 is 5 to 15 V. The period t1 is approximately 1 to 10 seconds, and the period t2 is approximately $10^{-8}$ to $10^{-4}$ seconds.

A charge can be thus accumulated in the upper insulating film IF2, and the clearance between the equipotential curves can be made small at a source end. Further, an ON current can be made large by enhancing the electric field at a source end, thereby allowing the driving capability of the transistor to be improved.

Second Embodiment

In First Embodiment, a charge is accumulated in the upper insulating film IF2 by using the gate electrode GE and by applying a high potential to the gate electrode GE; however, a charge may also be accumulated in the upper insulating film IF2 by providing and using a charge injection electrode CIE.

Hereinafter, a semiconductor device according to the present embodiment will be described in detail with reference to the views. In the embodiment, the configurations of parts other than the charge injection electrode CIE are the same as those of the semiconductor device according to First Embodiment. Accordingly, the same structures and manufacturing steps as those in First Embodiment will be briefly described.

[Structure Description]

Figure 17:
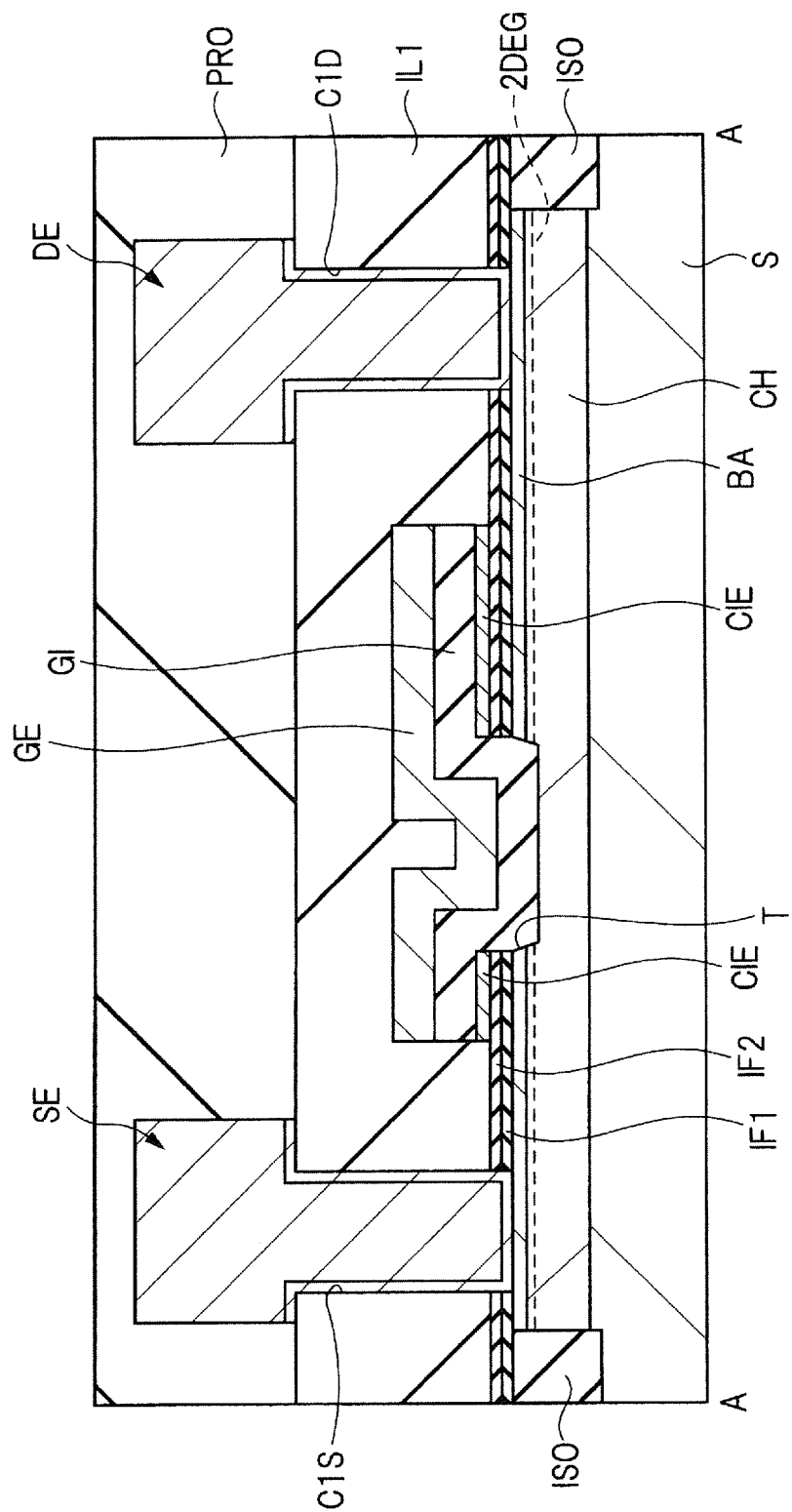
FIG. 17 is a sectional view illustrating a configuration of a semiconductor device according to Second Embodiment.
Figure 18:
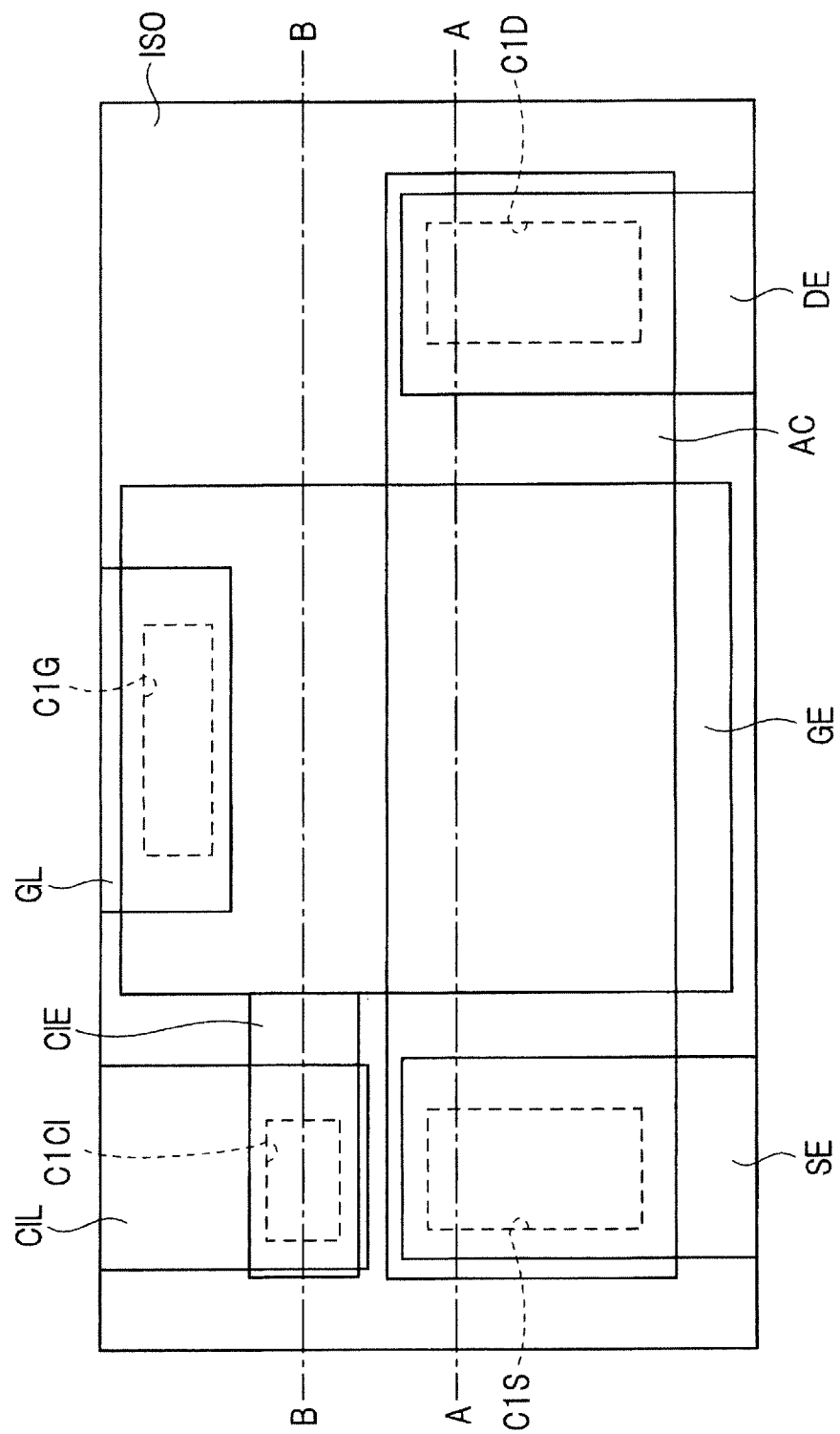
FIG. 18 is a plan view illustrating the configuration of the semiconductor device according to Second Embodiment.
Figure 19:
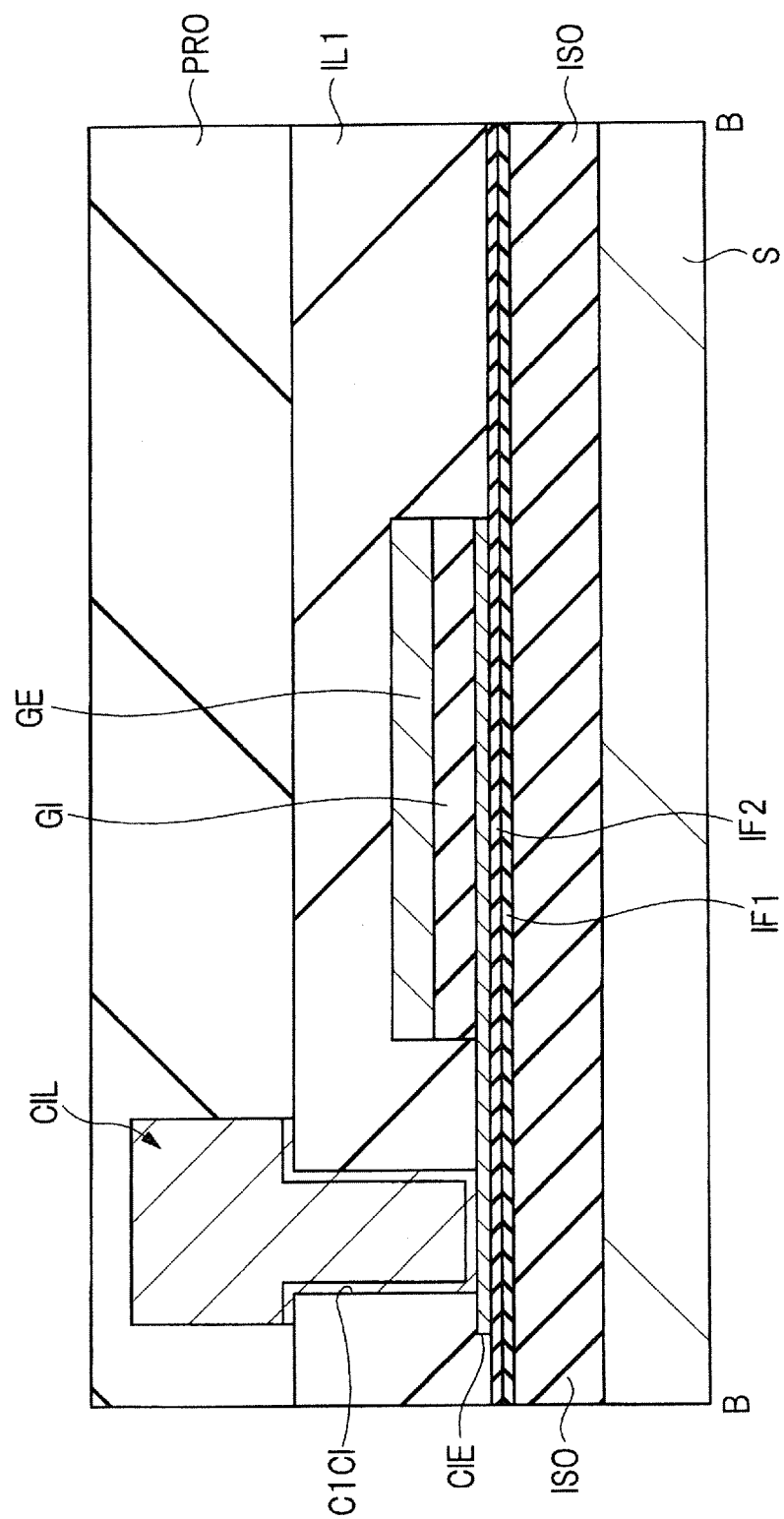
FIG. 19 is a sectional view illustrating the configuration of the semiconductor device according to Second Embodiment.

FIGS. 17 and 19 are sectional views illustrating a configuration of the semiconductor device according to the present embodiment. FIG. 18 is a plan view illustrating the configuration of the semiconductor device according to the embodiment. The sectional view of FIG. 17 corresponds, for example, to A-A Section in FIG. 18, and the sectional view of FIG. 19 corresponds, for example, to B-B Section in FIG. 18.

The semiconductor device according to the present embodiment is also a MIS-type field effect transistor using a nitride semiconductor, similarly to the First Embodiment. The semiconductor device according to the embodiment is also a so-called recess gate-type semiconductor device.

In the semiconductor device according to the present embodiment, a channel layer CH and a barrier layer BA are formed in this order over a substrate S, as illustrated in FIG. 17. An active region AC, in which a transistor is to be formed, is divided by an element isolation region ISO (see FIG. 18).

An insulating film (IF1, IF2) is formed over the barrier layer BA. This insulating film includes two layers of insulating films. A lower insulating film IF1 is formed over the barrier layer BA, and an upper insulating film IF2 is formed over the lower insulating film IF1.

This insulating film (IF1, IF2) has a role of an etching stopper when a gate electrode GE is patterned. The upper insulating film IF2 is a film having a bandgap smaller than that of the lower insulating film IF1. Additionally, the upper insulating film IF2 is a film having a bandgap smaller than that of the later-described gate insulating film GI.

In the present embodiment, a charge injection electrode CIE is further formed over the insulating film IF2.

The gate electrode GE is formed, via the gate insulating film GI, in a trench T that penetrates the charge injection electrode CIE, the insulating film (IF1, IF2), and the barrier layer BA to reach the middle of the channel layer CH. The channel layer CH and the barrier layer BA include a nitride semiconductor, and the barrier layer BA is a nitride semiconductor having a bandgap wider (having an electron affinity smaller) than that of the channel layer CH. The charge injection electrode CIE includes a conductive film.

A two-dimensional electron gas 2DEG is generated in the vicinity of the interface between the channel layer CH and the barrier layer BA, the vicinity being near to the channel layer CH. When a threshold potential (potential V2>0) is applied to the gate electrode GE, a channel is formed in the vicinity of the interface between the gate insulating film GI and the channel layer CH.

The configuration of the semiconductor device according to the present embodiment will be further described in detail. In the semiconductor device according to the embodiment, the channel layer CH including a nitride semiconductor is formed over the substrate S, and the barrier layer BA including a nitride semiconductor is formed over the channel layer CH, as illustrated in FIG. 17. Alternatively, a nucleation layer, a strain relaxation layer, and a buffer layer, etc., may be provided between the substrate S and the channel layer CH in this order from the substrate S side.

The gate electrode GE is formed, via the gate insulating film GI, in the trench T that penetrates the charge injection electrode CIE, the insulating film (IF1, IF2), and the barrier layer BA and is dug to the middle of the channel layer CH.

Figure 21:
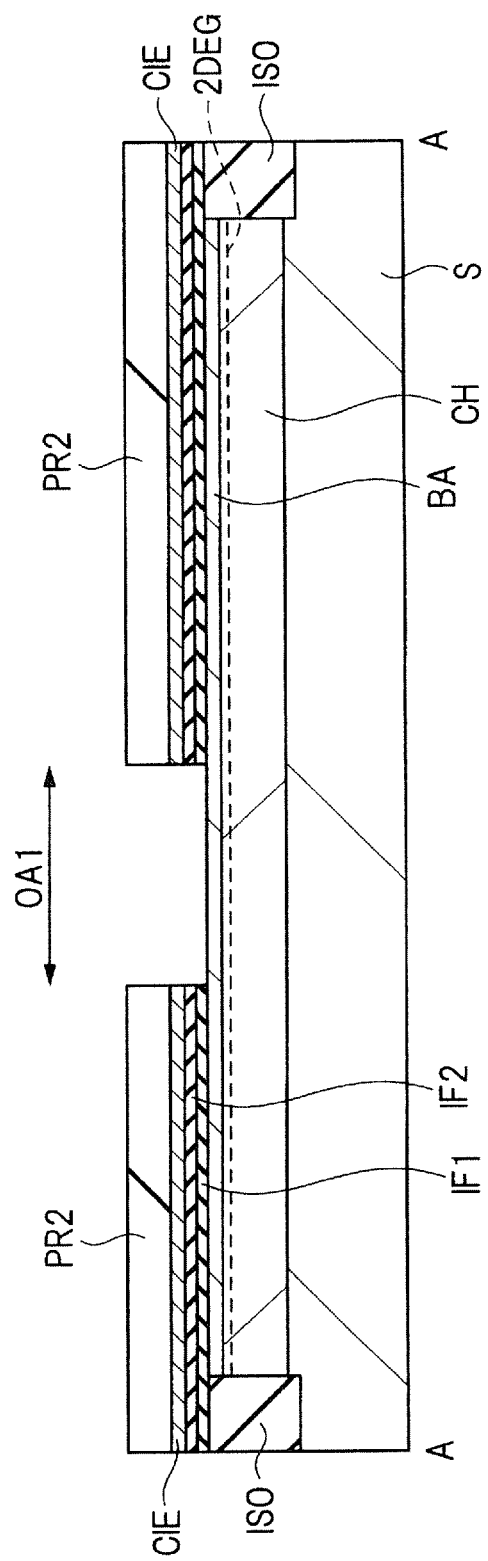
FIG. 21 is a sectional view illustrating a manufacturing step of the semiconductor device according to Second Embodiment, the manufacturing step following FIG. 20.

Each of the charge injection electrode CIE and the insulating film (IF1, IF2) has an opening in an opening region OA1 (see FIG. 21). The trench T is formed to correspond to the opening.

The gate insulating film GI is formed in the trench T and over the charge injection electrode CIE and the insulating film (IF1, IF2). The gate electrode GE is formed over the gate insulating film GI. The planar shape of the gate electrode GE is, for example, rectangular (see FIG. 18). Herein, the planar shapes of the gate insulating film GI and the gate electrode GE are the same as each other. The charge injection electrode CIE has both a rectangular portion located below the gate electrode GE and a contact part pulled out from this portion (also referred to as a pulled-out part), as described later. In the portion of the trench T, however, the charge injection electrode CIE is not formed (see FIG. 29).

The gate electrode GE has a shape protruding in one direction (to the right side, i.e., to a drain electrode DE side in FIG. 1). This protruding part is referred to as a field plate electrode. The gate electrode GE also extends from an end portion of the trench T near to a source electrode SE toward the source electrode SE. The charge injection electrode CIE is arranged below the gate electrode part protruding (extending) toward the drain electrode DE or the source electrode SE, and the insulating film (IF1, IF2) is further arranged below the charge injection electrode CIE.

Additionally, the source electrode SE and the drain electrode DE are formed over the barrier layer BA located on both the sides of the gate electrode GE. The barrier layer BA and either of the source electrode SE or the drain electrode DE is ohmic-coupled via an ohmic layer. The source electrode SE includes both a coupling part (plug), located in a contact hole C1S formed in an interlayer insulating film IL1, and a wiring part located over the coupling part. The drain electrode DE includes both a coupling part (plug), located in a contact hole C1D formed in the interlayer insulating film IL1, and a wiring part located over the coupling part. The source electrode SE and the drain electrode DE are covered with a protective insulating film PRO. The planar shape of each of the source electrode SE and the drain electrode DE is, for example, rectangular (see FIG. 18).

The aforementioned gate electrode GE is coupled to gate wiring GL via a coupling part (plug) located in a contact hole C1G formed in the interlayer insulating film IL1 (see FIG. 18). The charge injection electrode CIE is pulled out from a lower portion of the gate electrode GE to be coupled to the charge injection wiring CIL via a coupling part (plug) located in a contact hole C1CI formed in the interlayer insulating film IL1 (see FIGS. 18 and 19).

By forming the upper insulating film IF2 with a film having a bandgap smaller than that of the lower insulating film IF1, as described above, a charge (herein, electron) can be accumulated in the upper insulating film IF2, similarly to First Embodiment, thereby allowing the electric field strength at a corner of the trench to be improved. As a result, a channel is fully formed even at the corner of the trench, thereby allowing an ON-resistance to be reduced and an ON-current to be increased. Thus, the driving capability of the transistor can be improved.

Because the charge injection electrode CIE is provided over the upper insulating film IF2, a charge can be injected into the insulating film IF2 with a voltage lower than that in First Embodiment. Additionally, the gate electrode GE and the charge injection electrode CIE can be individually controlled, and hence a charge injection step and a driving step of the transistor can be individually performed.

[Description of Manufacturing Method]

Subsequently, a manufacturing method of the semiconductor device according to the present embodiment will be described with reference to FIGS. 20 to 31, so that the configuration of the semiconductor device will be made clearer. FIGS. 20 to 31 are sectional views or plan views each illustrating a manufacturing step of the semiconductor device according to the embodiment.

Figure 20:
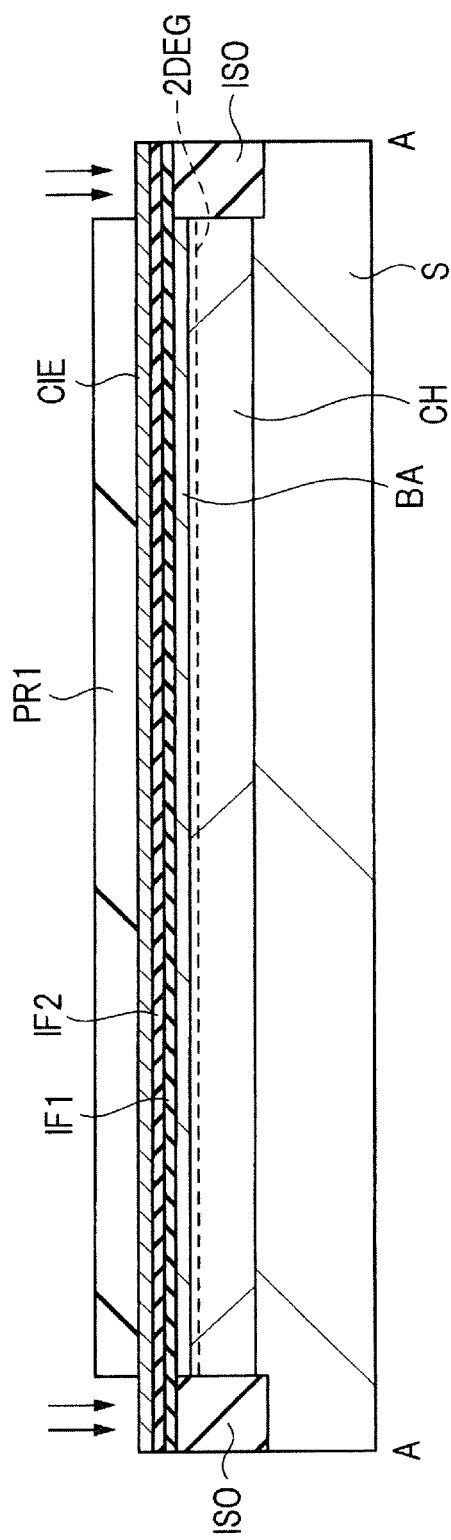
FIG. 20 is a sectional view illustrating a manufacturing step of the semiconductor device according to Second Embodiment.

As illustrated in FIG. 20, the channel layer (GaN) CH, the barrier layer (AlGaN) BA, the insulating film (silicon oxide film) IF1, and the insulating film (silicon nitride film) IF2 are sequentially formed over the substrate S that is the same as that in First Embodiment, in the same way as that in First Embodiment. The bandgap of the lower silicon oxide film is 8.9 eV, while that of the upper silicon nitride film is 4.5 eV. Thus, the bandgap of the upper silicon nitride film is smaller than that of the lower silicon oxide film.

Subsequently, the charge injection electrode CIE is formed over the insulating film IF2. For example, a tungsten (W) film is deposited, as a conductive film, over the insulating film IF2 by using a sputtering method, or the like. Alternatively, metals other than W, such as TiN (titanium nitride), and the compounds thereof (however, conductive compounds) may be used as the charge injection electrode CIE.

Subsequently, a photoresist film PR1 for opening the element isolation region is formed over charge injection electrode CIE by using a photolithography technique. Subsequently, the element isolation region ISO is formed by doping boron (B) or nitrogen (N) with the use of the photoresist film PR1 as a mask, similarly to First Embodiment. Thereafter, the photoresist film PR1 is removed. The region surrounded by the element isolation region ISO will serve as the active region AC (see FIG. 18).

Subsequently, a photoresist film PR2 having an opening in the opening region OA1 is formed over the charge injection electrode CIE by using a photolithography technique, as illustrated in FIG. 21. Subsequently, the charge injection electrode CIE and the insulating film (IF1, IF2) are etched by using the photoresist film PR2 as a mask. A gas, such as, for example, $Cl_2$ or $CF_4$, can be used as an etching gas for the charge injection electrode CIE. A gas, such as, for example, $CF_4$ or $CHF_3$, can be used as an etching gas for a silicon nitride film and a silicon oxide film. Thereby, a laminated film of the charge injection electrode CIE and the insulating film (IF1, IF2), having an opening in the opening region OA1, is formed over the barrier layer BA. In other words, the barrier layer BA is exposed in the opening region OA1 (FIG. 21).

Figure 22:
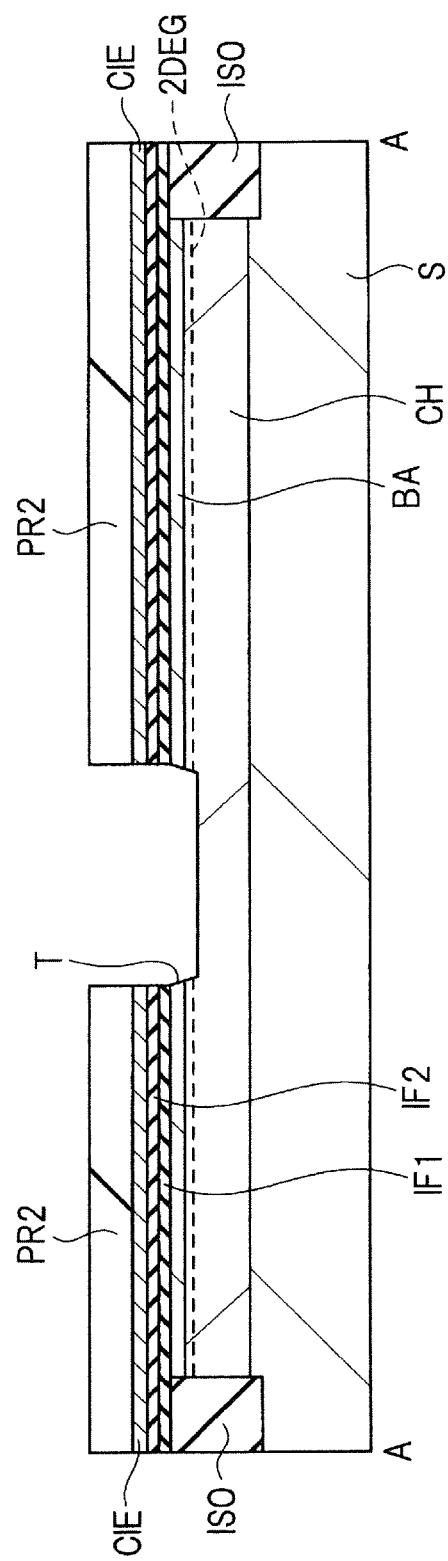
FIG. 22 is a sectional view illustrating a manufacturing step of the semiconductor device according to Second Embodiment, the manufacturing step following FIG. 21.

Continuously, the trench T, which penetrates the charge injection electrode CIE, the insulating film (IF1, IF2), and the barrier layer BA to reach the middle of the channel layer CH, is formed by etching the barrier layer BA and the channel layer CH with the use of the photoresist film PR2 as a mask, as illustrated in FIG. 22. Dry etching is performed under plasma atmosphere by using, for example, a halogen-based gas ($Cl_2$, HBr, $BCl_3$, or the like) as the etching gas. For example, ICP (Inductively Coupled Plasma), or the like, can be used as the plasma source. When the barrier layer (AlGaN) BA having a thickness of 0.03 μm is used, the etching is performed to the depth of approximately 0.04 μm from the surface of the barrier layer (AlGaN) BA in order to surely remove the two-dimensional electron gas 2DEG in the opening region OA1. Thereby, the barrier layer (AlGaN) BA and the surface portion of the channel layer (GaN) CH in the opening region OA1 are removed, so that the channel layer (GaN) CH is exposed. Subsequently, the photoresist film PR2 is removed.

Figure 23:
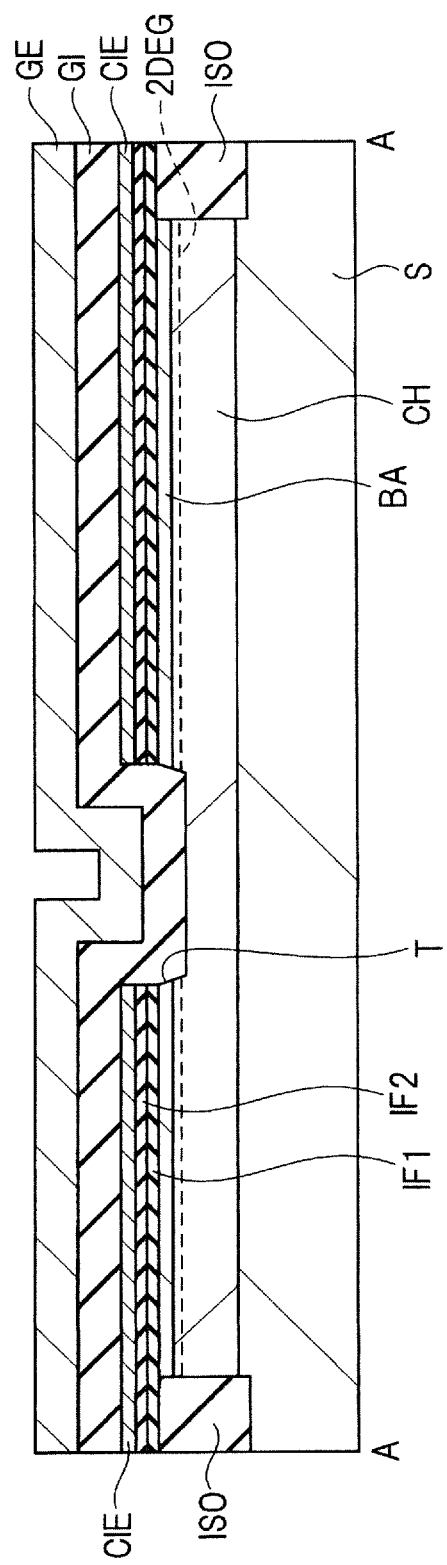
FIG. 23 is a sectional view illustrating a manufacturing step of the semiconductor device according to Second Embodiment, the manufacturing step following FIG. 22.

Subsequently, the gate insulating film GI is formed in the trench T and over the charge injection electrode CIE, as illustrated in FIG. 23. For example, an aluminum oxide film (alumina, $Al_2O_3$) having a thickness of approximately 0.1 μm is deposited, as the gate insulating film GI, in the trench T and over the insulating film (IF1, IF2) by using an ALD method, or the like, similarly to First Embodiment. The bandgap of the gate insulating film GI is larger than that of the insulating film (silicon nitride film) IF2 located therebelow. The bandgap of the aluminum oxide film is 6 eV, while that of the silicon nitride film located therebelow is 4.5 eV.

Alternatively, the silicon oxide film described in First Embodiment or a high dielectric constant film having a dielectric constant higher than that of the silicon oxide film may be used as the gate insulating film GI. Herein, the thickness (0.1 µm) of the gate insulating film (silicon oxide film) GI is larger than the depth (the first depth and the second depth) of the trench T, similarly to First Embodiment.

Subsequently, the gate electrode GE is formed over the gate insulating film GI. For example, a laminated film including, for example, a nickel (Ni) film and a gold (Au) film located thereabove (also referred to as an Au/Ni film) is deposited, as a conductive film, over the gate insulating film GI by using a sputtering method, or the like, similarly to First Embodiment.

Figure 24:
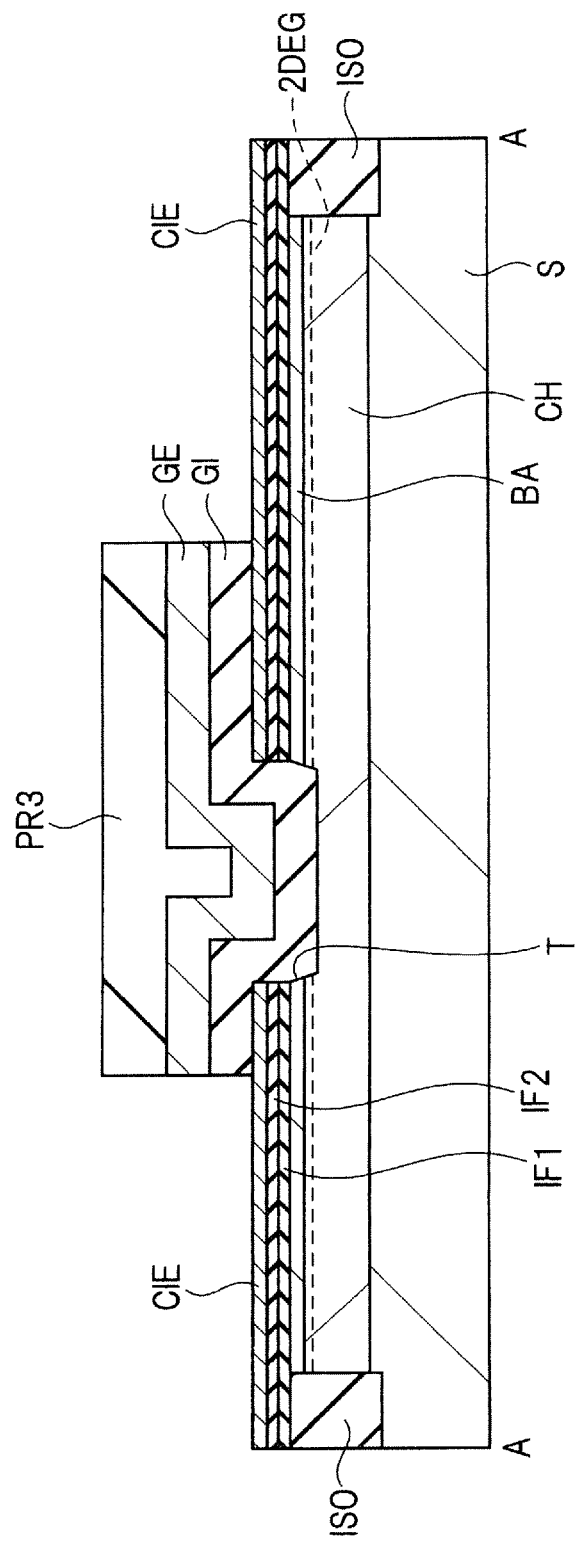
FIG. 24 is a sectional view illustrating a manufacturing step of the semiconductor device according to Second Embodiment, the manufacturing step following FIG. 23.
Figure 25:
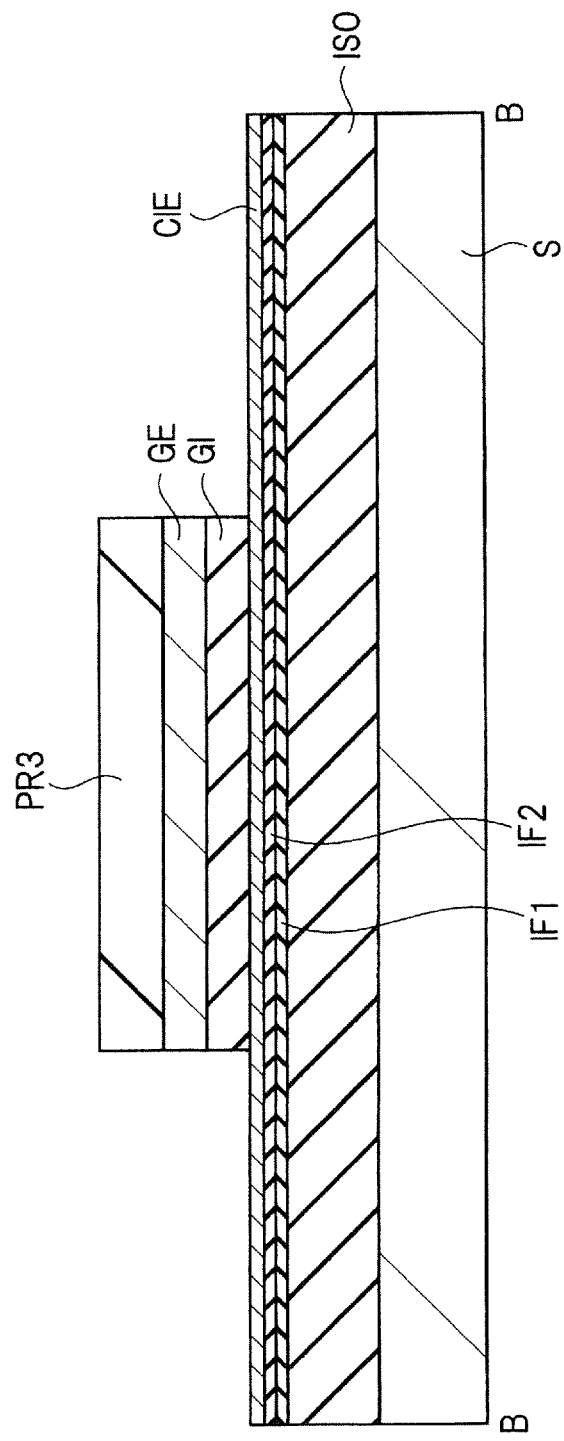
FIG. 25 is a sectional view illustrating a manufacturing step of the semiconductor device according to Second Embodiment.
Figure 26:
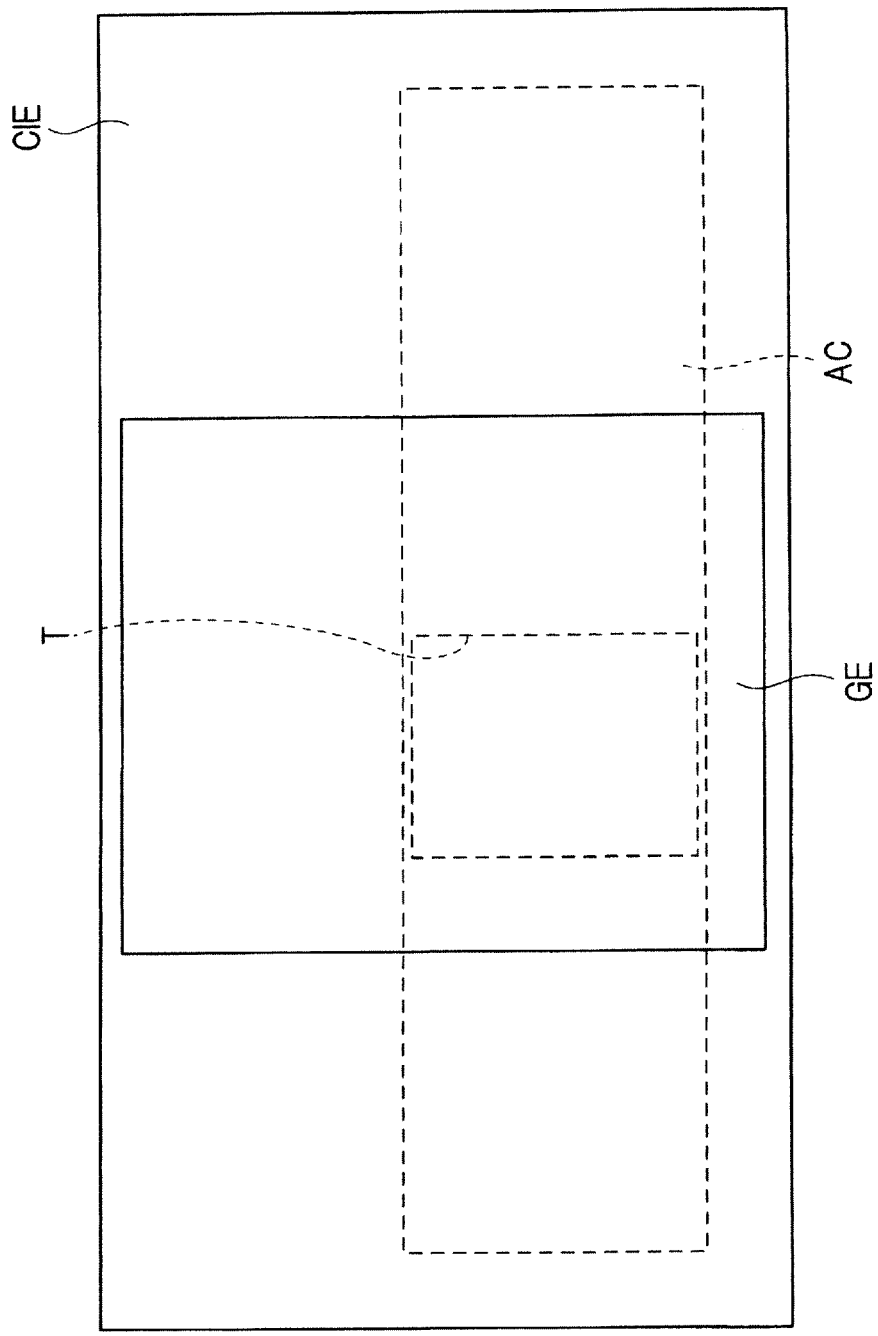
FIG. 26 is a plan view illustrating a manufacturing step of the semiconductor device according to Second Embodiment.

Subsequently, the gate electrode GE is formed by patterning the gate electrode GE and the gate insulating film GI with the use of a photolithography technique and an etching technique, as illustrated in FIGS. 24 to 26. A photoresist film PR3, covering the region where the gate electrode GE is formed, is formed by using, for example, a photolithography technique, so that the gate electrode GE and the gate insulating film GI are etched by using the photoresist film PR3 as a mask. Dry etching is performed under plasma atmosphere by using, for example, a halogen-based gas ($Cl_2$, HBr, $BCl_3$, or the like, or a mixed gas thereof) as the etching gas. For example, ICP (Inductively Coupled Plasma), or the like, can be used as the plasma source. Thereafter, the photoresist film PR3 is removed. Thereby, the rectangular gate electrode GE can be formed, as illustrated in FIG. 26. The charge injection electrode CIE is exposed around the gate electrode GE (FIGS. 24 to 26).

Figure 27:
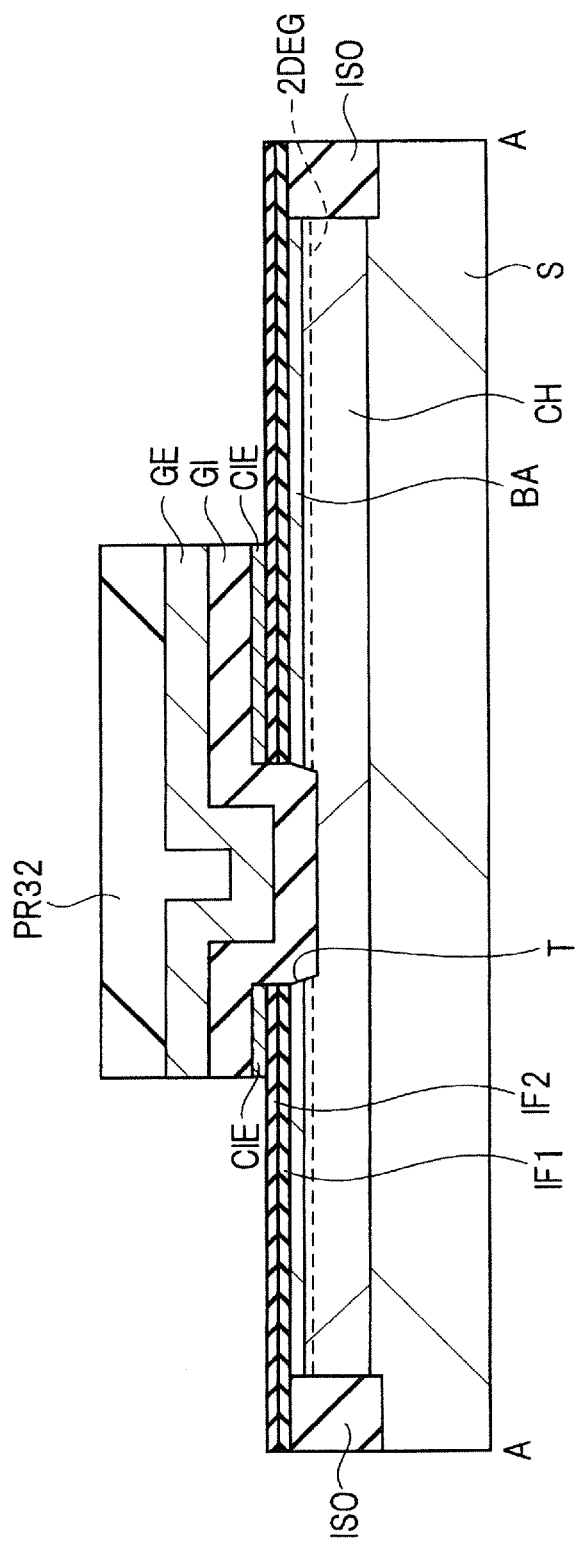
FIG. 27 is a sectional view illustrating a manufacturing step of the semiconductor device according to Second Embodiment, the manufacturing step following FIG. 24.
Figure 28:
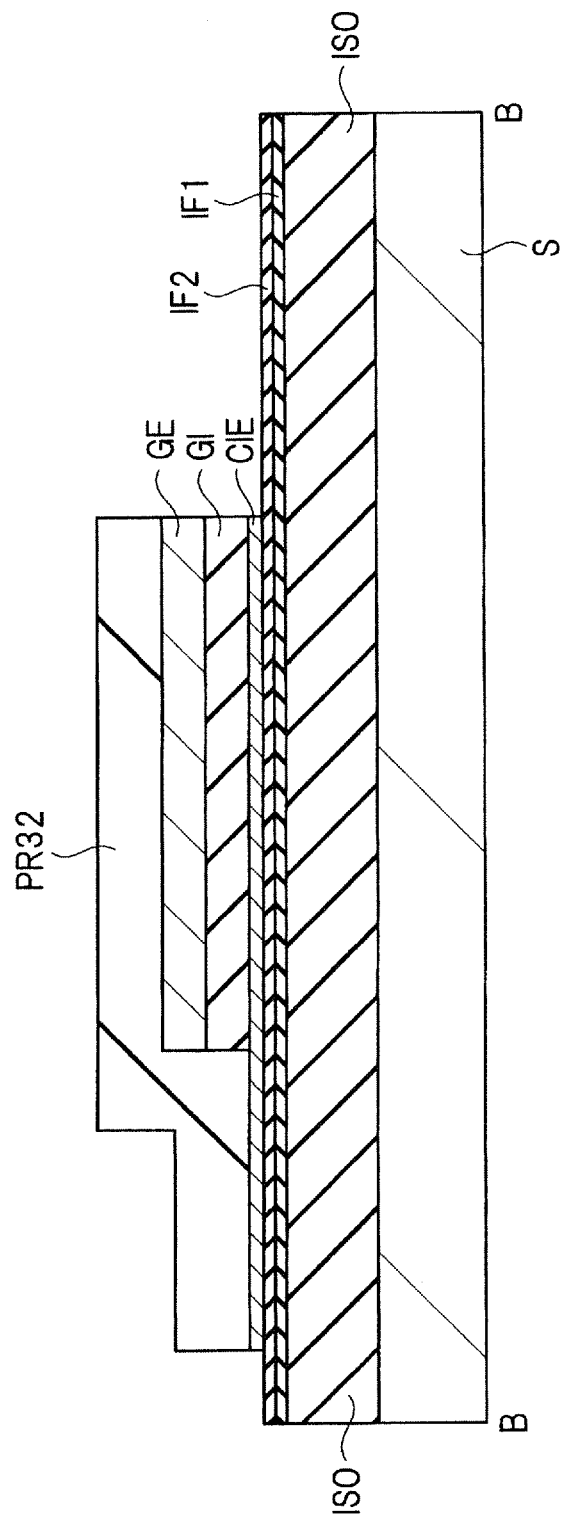
FIG. 28 is a sectional view illustrating a manufacturing step of the semiconductor device according to Second Embodiment, and accords with line B designated in FIG. 18.
Figure 29:
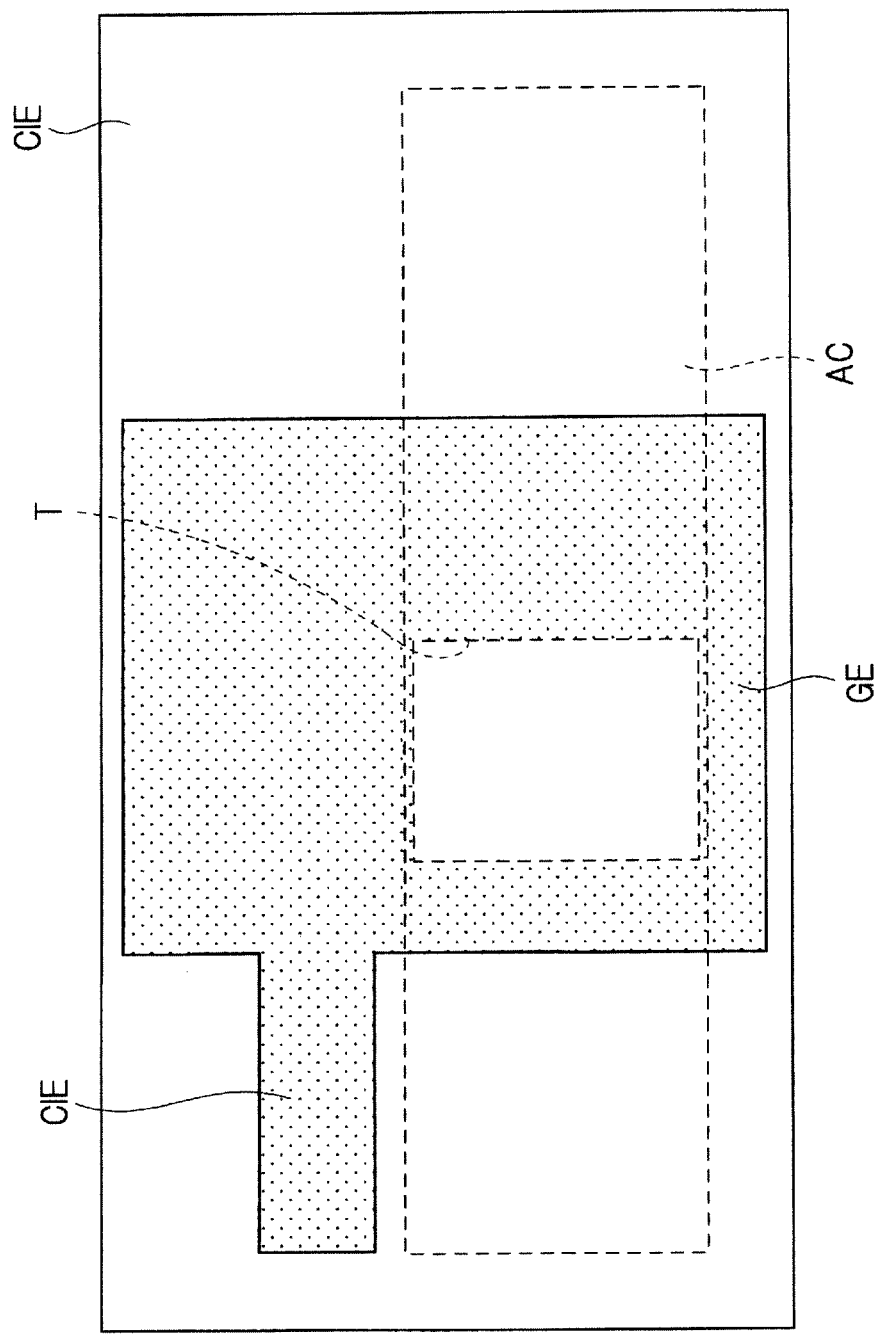
FIG. 29 is a plan view illustrating a manufacturing step of the semiconductor device according to Second Embodiment.

Subsequently, the charge injection electrode CIE is patterned by using a photolithography technique and an etching technique, as illustrated in FIGS. 27 to 29. A photoresist film PR32, covering the region where the charge injection electrode CIE is formed, is formed by using, for example, a photolithography technique, so that the charge injection electrode CIE is etched by using the photoresist film PR32 as a mask. Dry etching is performed under plasma atmosphere by using, for example, $Cl_2$ or HBr as the etching gas. For example, ICP (Inductively Coupled Plasma), or the like, can be used as the plasma source. Thereafter, the photoresist film PR32 is removed. Thereby, the charge injection electrode CIE, which has both a rectangular portion located below the gate electrode GE and a contact part pulled out from this portion (also referred to as a pulled-out part, a protruding part on the left side of FIG. 29), can be formed, as illustrated in FIG. 29. In the portion of the trench T, the charge injection electrode CIE is removed in the step of forming the trench T. Accordingly, the hatched portion illustrated in FIG. 29 serves as the region where the charge injection electrode CIE is to be formed.

The insulating film (IF1, IF2) serves as an etching stopper when the charge injection electrode CIE is etched. If dry etching is performed on the charge injection electrode CIE directly formed over the barrier layer BA without forming the insulating film (IF1, IF2) by using the photoresist film PR32 as a mask, the barrier layer BA may be damaged and the operating characteristic of the transistor may be deteriorated, similarly to First Embodiment.

On the other hand, the insulating film (IF1, IF2) functions as an etching stopper in the present embodiment, and hence the characteristics of the transistor can be improved.

Additionally, the surface of the insulating film (IF1, IF2) exposed at both the ends of the gate electrode GE may be retreated. However, it is preferable that the upper insulating film IF2 remains when the etching is ended. For example, when a silicon oxide film is used as the gate insulating film GI and when the lower insulating film (silicon oxide film) IF2 is exposed, the lower insulating film IF2 is rapidly etched and the lower barrier layer BA is exposed to the etching atmosphere, which may cause the barrier layer BA to be damaged by etching. Because the thickness of the barrier layer BA is small as described above, the two-dimensional electron gas is likely to be affected when the barrier layer BA is damaged. Accordingly, it is preferable to stop etching in the state where the upper insulating film remains.

The gate electrode GE is patterned to have a shape protruding in one direction (to the right side, i.e., to the drain electrode DE side in FIG. 24). In other words, the patterning is performed such that a field plate electrode is provided as part of the gate electrodes GE. The field plate electrode is a partial region of the gate electrode GE, and refers to an electrode portion extending from the end portion of the trench T near to the drain electrode DE toward the drain electrode DE. The gate electrode GE also protrudes in another direction (to the left side, i.e., to the source electrode SE side in FIG. 24). However, the amount of the protrusion to the drain electrode DE side is larger than that to the source electrode SE side.

Figure 30:
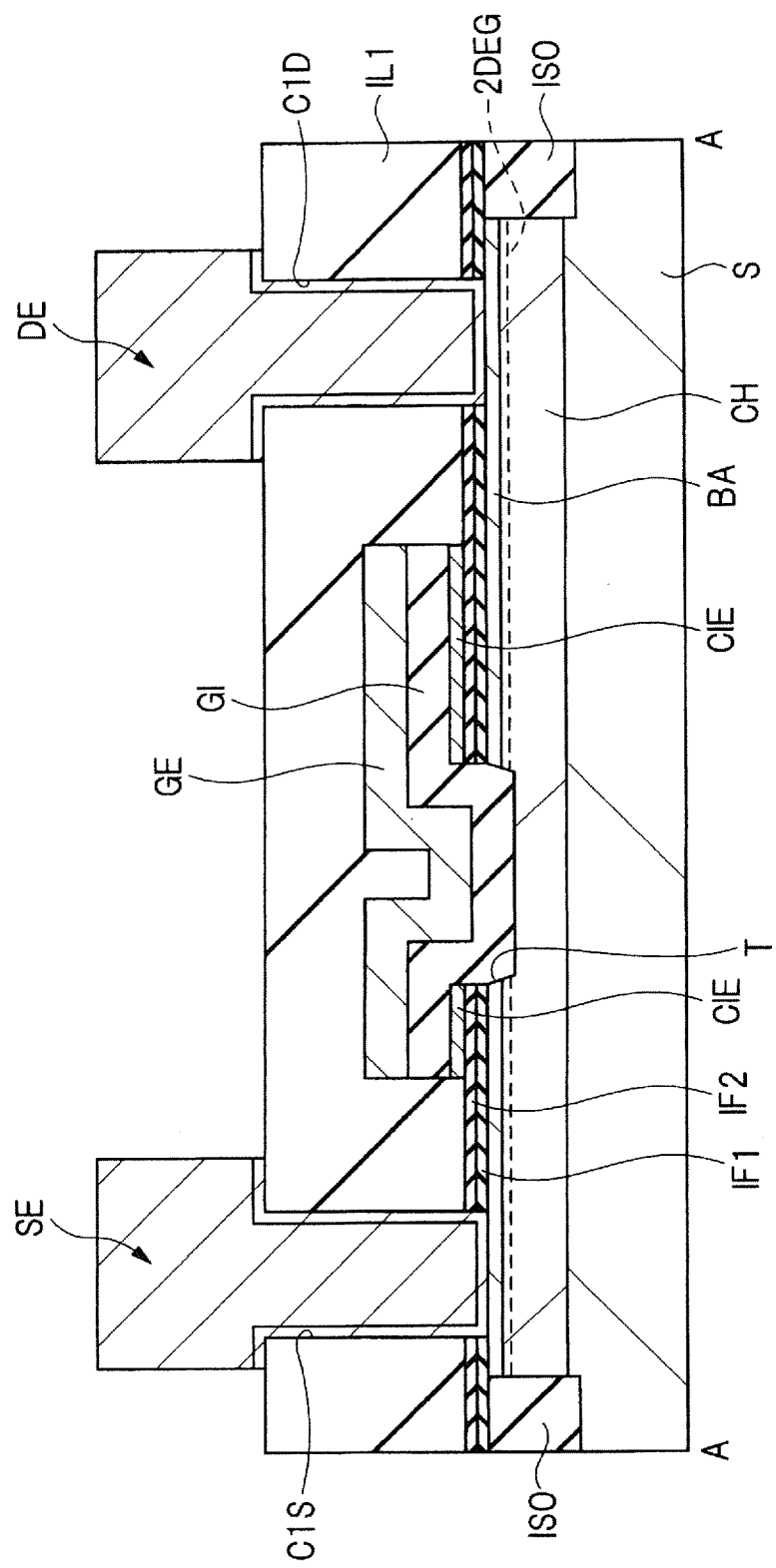
FIG. 30 is a sectional view illustrating a manufacturing step of the semiconductor device according to Second Embodiment, the manufacturing step following FIG. 27.
Figure 31:
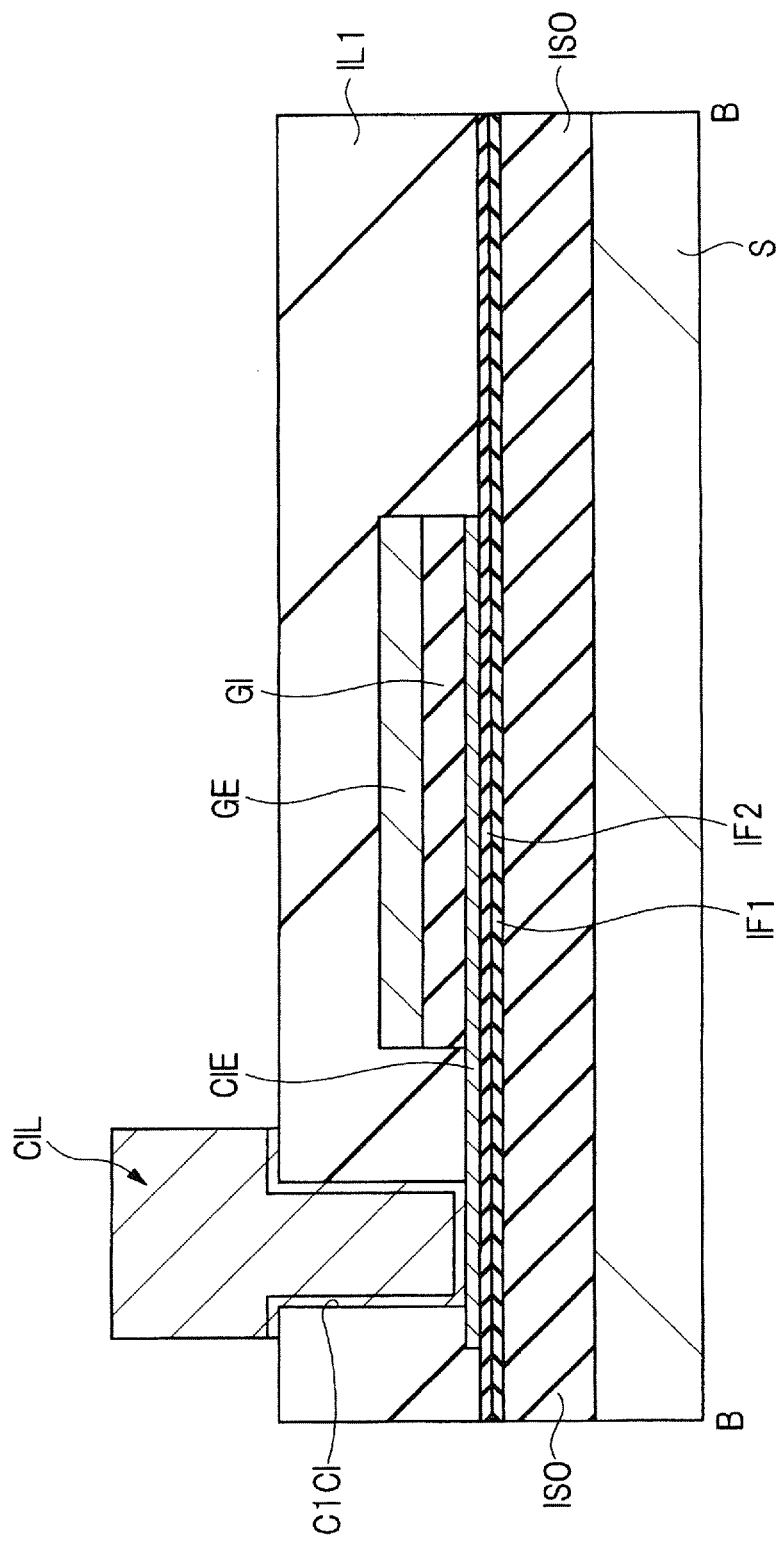
FIG. 31 is a sectional view illustrating a manufacturing step of the semiconductor device according to Second Embodiment, and accords with line B designated in FIG. 18.

Subsequently, the interlayer insulating film IL1, the source electrode SE, and the drain electrode DE are formed over the gate electrode GE, as illustrated in FIGS. 30 and 31. After the interlayer insulating film IL1 is formed, for example, in the same way as that in First Embodiment, the contact holes C1S and C1D are formed. In this case, the contact hole (C1G) is formed over the gate electrode GE, while the contact hole C1CI is formed over the charge injection electrode CIE (see FIGS. 18 and 31).

Subsequently, a conductive film CL is formed over the interlayer insulating film IL1 including the insides of the contact holes C1S and C1D in the same way as that in First Embodiment, and then the source electrode SE and the drain electrode DE are formed by patterning the conductive film CL. In this case, the gate wiring GL is formed in and over the contact hole C1G above the gate electrode GE, and the charge injection wiring CIL is formed in and over the contact hole C1CI above the charge injection electrode CIE (see FIGS. 18 and 31).

Subsequently, the protective insulating film PRO is formed over the insulating film IL1 including over the source electrode SE and the drain electrode DE in the same way as that in First Embodiment (see FIG. 17, etc.).

The semiconductor device illustrated in FIG. 17 can be formed by the above steps. Herein, the above steps are one example, and the semiconductor device according to the present embodiment may be manufactured by the steps other than the above steps.

Thus, the upper insulating film IF2 is formed with a film having a bandgap smaller than that of the lower insulating film IF1 also in the present embodiment, similarly to First Embodiment, and hence a charge (herein, electron) can be accumulated in the upper insulating film IF2, thereby allowing the electric field strength at a corner of the trench to be improved. As a result, a channel is fully formed even at the corner of the trench, thereby allowing an ON-resistance to be reduced and an ON-current to be increased. Thus, the driving capability of the transistor can be improved (see FIGS. 14 and 15).

Figure 32A:
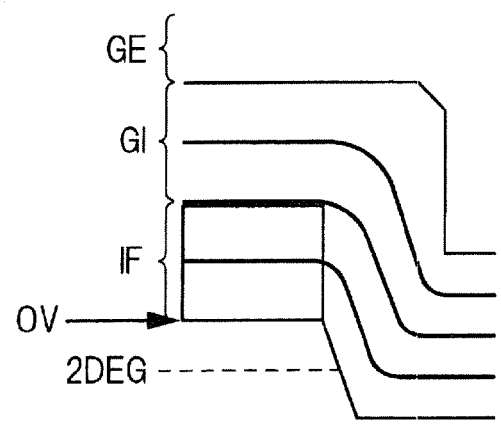
FIGS. 32A and 32B are schematic views of the vicinity of an end portion of the bottom surface of a trench, these views presented for explaining effects in Second Embodiment.
Figure 32B:
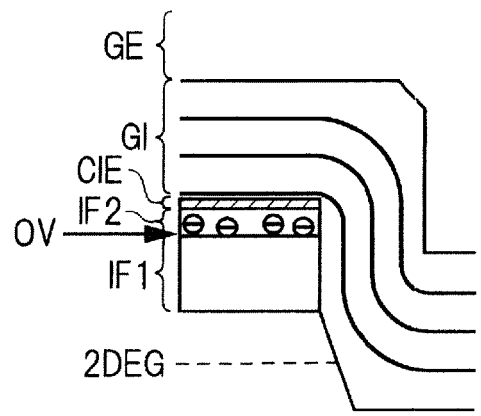
Figure 33:
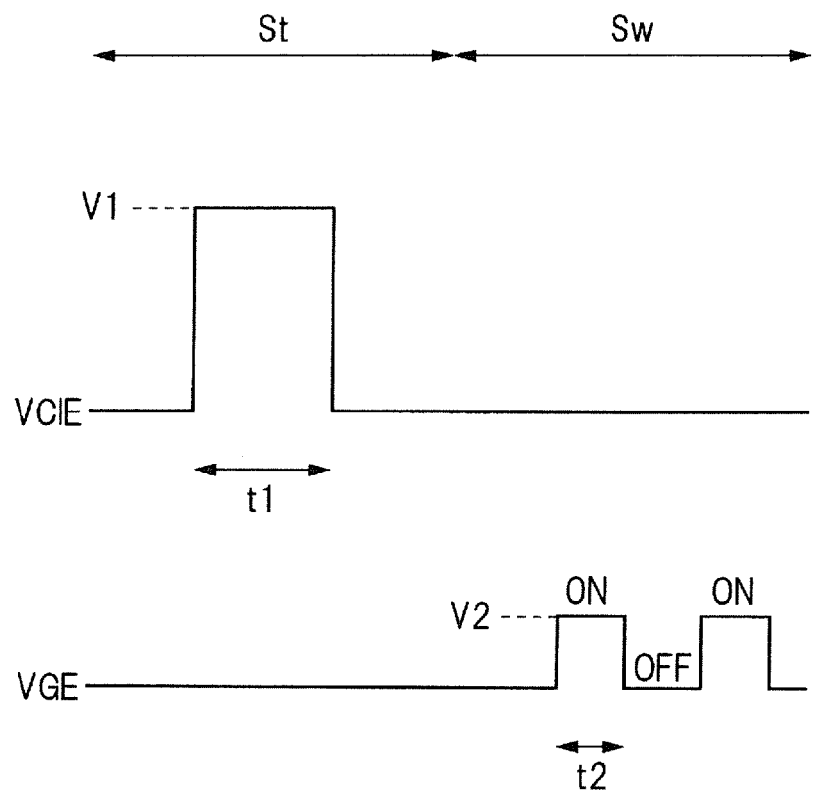
FIG. 33 is a timing chart illustrating both a step of injecting a charge into an upper insulating film in a transistor and a driving step of the transistor.

FIGS. 32A and 32B are schematic views of the vicinity of an end portion of the bottom surface of the trench, these views presented for explaining effects in the present embodiment. FIG. 33 is a timing chart illustrating both a step of injecting a charge into the upper insulating film in the transistor and a driving step of the transistor.

When a single-layer insulating film (e.g., silicon oxide film) IF is used as the cover film, the clearance between the equipotential curves located between the bottom surface of the insulating film IF and that of the gate electrode GE becomes large, as illustrated in FIG. 32A. On the other hand, when a charge (herein, electron) is accumulated in the upper insulating film IF2, as in the present embodiment, the clearance between the equipotential curves located between the bottom surface of the insulating film IF2 and that of the gate electrode GE becomes small, as illustrated in FIG. 32B. An ON-current can be made large by thus enhancing the electric field at a source end, thereby allowing the driving capability of the transistor to be improved.

Injection of a charge into the upper insulating film IF2 can be performed by providing, to the charge injection electrode CIE, a high voltage (potential V1) of such a degree that a tunnel current flows through the lower insulating film IF1. For example, when the insulating film IF1, which has been described in the present embodiment and has a thickness of approximately 0.02 μm, is used, a charge can be injected into the upper insulating film IF2 from the two-dimensional electron gas 2DEG via the insulating film IF1 by applying a potential of approximately 30 to 50 V to the charge injection electrode CIE. Alternatively, when the thickness of the insulating film IF1 is approximately 0.01 to 0.03 μm, a charge can be injected into the insulating film IF2 with a potential of approximately 15 to 30 V.

For example, the potential V1 is applied to the charge injection electrode CIE for a period t1 in a stand-by period St, as illustrated in FIG. 33. In this state, each of the source potential and the drain potential is, for example, 0 V. Thereby, a charge is accumulated in the upper insulating film IF2. Thereafter, the transistor is caused to be in an ON state by applying, to the gate electrode GE, the potential V2 for a period t2 in a switching period Sw during which the transistor is ON/OFF operated. In this state, the source potential is, for example, 0 V and the drain potential is, for example, 0 to 10 V. The potential V1 is 15 to 30 V, and the potential V2 is 5 to 15 V. The period t1 is longer than the period t2. The period t1 is approximately 1 to 10 seconds, and the period t2 is approximately $10^{-8}$ to $10^{-4}$ seconds.

Thus, a charge can be accumulated in the upper insulating film IF2, the clearance between the equipotential curves can be made small at a source end, and an ON-current can be made large by enhancing the electric field at the source end, thereby allowing the driving capability of the transistor to be improved.

The invention made by the present inventors has been specifically described above based on preferred embodiments; however, it is needless to say that the invention should not be limited to the preferred embodiments and various modifications may be made to the invention within a range not departing from the gist of the invention.

In the aforementioned First Embodiment (see FIG. 15), an example has been described, in which a silicon oxide film, a silicon nitride film, and an aluminum oxide film are used as the combination of the insulating film IF1, the insulating film IF2, and the gate insulating film GI. On the other hand, other combinations may be used, in which the bandgaps of these films (Eg (IF1), Eg (IF2), and Eg (GI)) satisfy the relationships: Eg (IF1)>Eg (IF2); and Eg (GI)>Eg (IF2). For example, a combination of a silicon oxide film, a silicon nitride film, and a silicon oxide film may be used as the combination of the insulating film IF1, the insulating film IF2, and the gate insulating film GI.

Additionally, a charge is injected in the stand-by period St and the transistor is driven (ON/OFF operated) in the subsequent switching period Sw; however, the stand-by period St may be provided only once at the initial stage, or provided regularly (every predetermined period) in the switching period Sw. Alternatively, a charge may be injected into the insulating film IF2 before every ON/OFF operation.

What is claimed is:

1. A semiconductor device comprising:
a first nitride semiconductor layer formed above a substrate;
a second nitride semiconductor layer that is formed over the first nitride semiconductor layer and has a bandgap wider than that of the first nitride semiconductor layer;
an insulating film formed above the second nitride semiconductor layer;
a trench that penetrates the insulating film and the second nitride semiconductor layer to reach a middle of the first nitride semiconductor layer; and
a gate electrode formed in the trench and over the insulating film via a gate insulating film,
wherein the insulating film has a first film and a second film formed over the first film,
wherein a bandgap of the second film is smaller than that of the first film, and
wherein a charge is accumulated in the second film.

2. The semiconductor device according to claim 1,
wherein the bandgap of the second film is smaller than that of the gate insulating film.

3. The semiconductor device according to claim 2,
wherein the first film is an oxide film and the second film is a nitride film.

4. The semiconductor device according to claim 3,
wherein the first film is a silicon oxide film and the second film is a silicon nitride film.

5. The semiconductor device according to claim 4,
wherein the gate insulating film is a silicon oxide film or an aluminum oxide film.

6. The semiconductor device according to claim 1,
wherein a thickness of the gate insulating film is larger than a level difference between a surface of the second nitride semiconductor layer and a bottom surface of the trench.

7. The semiconductor device according to claim 1,
wherein the thickness of the gate insulating film is larger than a level difference between a surface of the second film and the bottom surface of the trench.

8. The semiconductor device according to claim 1,
wherein the charge is injected into the second film by applying a first potential to the gate electrode.

9. The semiconductor device according to claim 8,
wherein a channel is formed in a bottom of the trench by applying a second potential to the gate electrode, and
wherein the first potential is larger than the second potential.

10. The semiconductor device according to claim 9,
wherein a period during which the first potential is being applied to the gate electrode is longer than a period during which the second potential is being applied to the gate electrode.

11. A semiconductor device comprising:
a first nitride semiconductor layer formed above a substrate;
a second nitride semiconductor layer that is formed over the first nitride semiconductor layer and has a bandgap wider than that of the first nitride semiconductor layer;
an insulating film formed above the second nitride semiconductor layer;
a conductive film formed over the insulating film;
a trench that penetrates the conductive film, the insulating film, and the second nitride semiconductor layer to reach a middle of the first nitride semiconductor layer; and
a gate electrode formed in the trench and over the conductive film via a gate insulating film,
wherein the insulating film has a first film and a second film formed over the first film,
wherein a bandgap of the second film is smaller than that of the first film, and
wherein a charge is accumulated in the second film.

12. The semiconductor device according to claim 11,
wherein the bandgap of the second film is smaller than that of the gate insulating film.

13. The semiconductor device according to claim 12,
wherein the first film is a silicon oxide film, the second film is a silicon nitride film, and wherein the gate insulating film is a silicon oxide film or an aluminum oxide film.

14. The semiconductor device according to claim 11,
wherein a thickness of the gate insulating film is larger than a level difference between a surface of the second nitride semiconductor layer and a bottom surface of the trench.

15. The semiconductor device according to claim 11,
wherein the thickness of the gate insulating film is larger than a level difference between a surface of the conductive film and the bottom surface of the trench.

16. The semiconductor device according to claim 11,
wherein the charge is injected into the second film by applying a first potential to the conductive film.

17. The semiconductor device according to claim 16,
wherein a channel is formed in a bottom of the trench by applying a second potential to the gate electrode, and
wherein the first potential is larger than the second potential.

18. The semiconductor device according to claim 17,
wherein a period during which the first potential is being applied to the conductive film is longer than a period during which the second potential is being applied to the gate electrode.

* * * * *